(12) United States Patent
Cheon et al.

(10) Patent No.: US 8,753,945 B2
(45) Date of Patent: Jun. 17, 2014

(54) METHOD OF MANUFACTURING A SEMICONDUCTOR DEVICE

(71) Applicant: Samsung Electronics Co., Ltd., Suwon-Si (KR)

(72) Inventors: Keon-Yong Cheon, Seoul (KR); Dong-Won Kim, Seongnam-si (KR); Sung-Man Lim, Seoul (KR); Sadaaki Masuoka, Seongnam-si (KR); Yaoqi Dong, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/687,104

(22) Filed: Nov. 28, 2012

(65) Prior Publication Data
US 2013/0252393 A1   Sep. 26, 2013

(30) Foreign Application Priority Data

Mar. 22, 2012  (KR) .................. 10-2012-0029492

(51) Int. Cl.
  *H01L 21/336* (2006.01)
(52) U.S. Cl.
  USPC .................... 438/303; 438/542; 257/E21.435
(58) Field of Classification Search
  USPC .................. 438/519; 257/E21.4, E21.435
  See application file for complete search history.

(56) References Cited

U.S. PATENT DOCUMENTS

| | | | |
|---|---|---|---|
| 5,677,224 A * | 10/1997 | Kadosh et al. ................ | 438/197 |
| 6,071,826 A | 6/2000 | Cho et al. | |
| 7,456,062 B1 * | 11/2008 | En et al. ....................... | 438/231 |
| 2002/0030234 A1 | 3/2002 | Ohuchi et al. | |
| 2005/0095796 A1 * | 5/2005 | van Bentum et al. ......... | 438/300 |
| 2005/0275034 A1 | 12/2005 | Deshpande et al. | |
| 2009/0166625 A1 | 7/2009 | Ting et al. | |
| 2009/0166753 A1 | 7/2009 | Hijzen et al. | |

FOREIGN PATENT DOCUMENTS

| | | |
|---|---|---|
| JP | 10-256247 A | 9/1998 |
| JP | 2000-114522 A | 4/2000 |
| KR | 2006-0000322 A | 1/2006 |

* cited by examiner

*Primary Examiner* — Cheung Lee
(74) *Attorney, Agent, or Firm* — Harness, Dickey & Pierce, P.L.C.

(57) ABSTRACT

In a method of forming MOS transistor, a gate structure is formed on a substrate and a first spacer layer is formed on the substrate conformal to the gate structure. A second spacer layer is formed on the first spacer layer. A second spacer is formed on the first spacer layer corresponding to a sidewall of the gate structure by partially removing the second spacer layer from the first spacer layer. Impurities are implanted in the substrate by an ion implantation process using the gate structure including the first spacer layer and the second spacer as an ion implantation mask to form source/drain extension regions at surface portions of the substrate around the gate structure.

16 Claims, 18 Drawing Sheets

METHOD OF MANUFACTURING A SEMICONDUCTOR DEVICE

CROSS-REFERENCE TO RELATED APPLICATIONS

This application claims the benefit of Korean Patent Application No. 10-2012-0029492 filed on Mar. 22, 2012 in the Korean Intellectual Property Office, the disclosure of which is incorporated herein in its entirety by reference.

BACKGROUND

1. Field

Some example embodiments relate to a method of manufacturing a semiconductor device and/or a method of manufacturing of a metal oxide silicon (MOS) transistor.

2. Description of the Related Art

As the integration degree of semiconductor devices increases, a MOS transistor of the semiconductor device has been downsized, and the downsizing of the MOS transistor causes various gate defects such as a punch-through phenomenon, a short channel effect, a leakage current from a gate body and a gate-induced drain leakage (GIDL).

SUMMARY

Some example embodiments of the present inventive concepts provide a method of manufacturing a semiconductor device having improved electrical characteristics in spite of the high integration degree.

According to an example embodiment, there is provided a method of manufacturing a semiconductor device. A gate structure is formed on a substrate, and the gate structure includes a gate insulation pattern and a gate electrode. A first spacer layer is formed on a surface of the substrate conformal to the gate structure. A second spacer layer is formed on the first spacer layer. The second spacer is formed on the first spacer layer corresponding to the sidewall of the gate structure by partially removing the second spacer layer from the first spacer layer. First impurities are implanted in the substrate by an ion implantation process using the gate structure including the first spacer layer and the second spacer as an ion implantation mask to form source/drain extension regions at surface portions of the substrate around the gate structure.

In an example embodiment, the first spacer layer and the second spacer layer may include first and second insulation materials, respectively and the second spacer layer may have an etching selectivity with respect to the first spacer layer. For example, the first spacer layer may include nitrogen and the second spacer layer may include oxygen.

In an example embodiment, a distance of lateral diffusion of the first impurities in the substrate may be determined, and the first spacer layer plus the second spacer may be formed to have a thickness from the sidewall of the gate structure based on the determined distance. The second spacer layer may be formed to have a deposition thickness based on the determined distance.

In an example embodiment, the first spacer layer is formed to a thickness of about 20 Å to about 50 Å. The second spacer may be formed to a thickness of about 20 Å to about 50 Å. In an example embodiment, the gate structure may be formed to have a line width of about 10 nm to about 30 nm.

In an example embodiment, the second spacer layer may be partially removed by performing an anisotropic etching process until the second spacer layer may be removed from the upper surface of the gate structure and from the surface of the substrate.

In an example embodiment, the second spacer layer may be partially removed by an anisotropic etching process until the first spacer layer may be exposed. In an example embodiment, the second spacer may be further removed from the substrate after the implanting.

In an example embodiment, a third spacer layer may be further formed on the first spacer layer and the second spacer and the third spacer layer may be partially removed from the substrate to form a third spacer on the second spacer. Second impurities may be implanted in the substrate by an ion implantation process using the gate structure including the first spacer layer, the second spacer and the third spacer as an ion implantation mask to form source/drain regions at surface portions of the substrate around the gate structure.

According to another example embodiment, there is provided another method of manufacturing a semiconductor device. A gate structure including a gate insulation pattern and a gate electrode is formed on a substrate. A preliminary spacer layer is formed on a surface of the substrate conformal to the gate structure. The spacer layer is formed conformal to the gate structure by partially removing the preliminary spacer from the substrate. The spacer layer has a first thickness as measured from the sidewall of the gate structure and a second thickness that is smaller than the first thickness is measured from the surface of the substrate and the upper surface of the gate structure. Impurities are implanted in the substrate by an ion implantation process using the gate structure including the spacer layer as an ion implantation mask to form source/drain extension regions at surface portions of the substrate around the gate structure.

In another example embodiment, the first thickness of the spacer layer may be in a range of about 40 Å to about 100 Å. The second thickness of the spacer layer may be in a range of about 20 Å to about 50 Å.

According to another example embodiment, a method of manufacturing a semiconductor device includes forming at least two spacer layers on a surface of a substrate conformal to a gate structure, the gate structure being formed on the substrate, and implanting first impurities in the substrate by an ion implantation process using the gate structure including the at least two spacer layers as an ion implantation mask to form source/drain extension regions at surface portions of the substrate around the gate structure. The at least two spacer layers each have a thickness of about 20 Å to about 50 Å.

In another example embodiment, forming at least two spacer layers may include forming a first spacer layer and a second spacer layer on the surface of the substrate conformal to the gate structure, and forming a second spacer on the first spacer layer corresponding to a sidewall of the gate structure by partially removing the second spacer layer from the first spacer layer.

In another example embodiment, a distance of lateral diffusion of the first impurities in the substrate may be determined, and the first spacer layer plus the second spacer may be formed to have a thickness from the sidewall of the gate structure based on the determined distance. In another example embodiment, the second spacer layer may be formed to a deposition thickness based on the determined distance.

In another example embodiment, the method may further include forming a third spacer layer on the first spacer layer and the second spacer, partially removing the third spacer layer to form a third spacer on the second spacer, and implanting second impurities in the substrate by an ion implantation process using the gate structure including the first spacer layer, the second spacer and the third spacer as an ion implantation mask to form source/drain regions at surface portions of the substrate around the gate structure.

According to example embodiments of the present inventive concepts, the overlap size between the source/drain extension region and the gate electrode may be minimized or reduced in the MOS transistor with a sufficiently shallow junction at the surface portion of the substrate around the gate electrode. Therefore, the operation defects of the transistor, e.g., the short channel effect, the leakage current and the punch-through, may be prevented or inhibited in the MOS transistor.

BRIEF DESCRIPTION OF THE DRAWINGS

Example embodiments will be more clearly understood from the following detailed description taken in conjunction with the accompanying drawings.

DETAILED DESCRIPTION OF EXAMPLE EMBODIMENTS

Figure 1A:
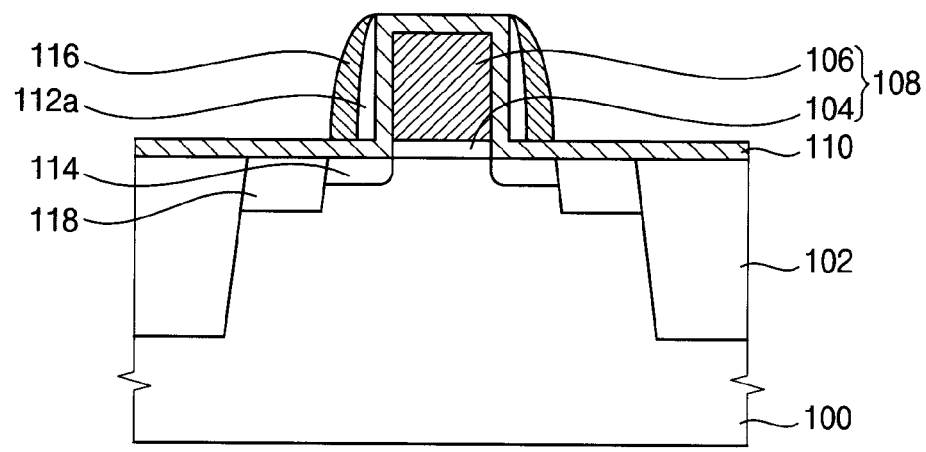
FIG. 1A is a cross-sectional view illustrating a MOS transistor in accordance with an example embodiment of the present inventive concepts.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiment I

FIG. 1A is a cross-sectional view illustrating a MOS transistor in accordance with an example embodiment of the present inventive concepts.

Referring to FIG. 1A, a MOS transistor in accordance with an example embodiment of the present inventive concepts may include a semiconductor substrate 100 and a gate structure 108, a first spacer layer 110, a second spacer 112a and a third spacer 116 on the substrate 100. Source/drain extension regions 114 and source/drain regions 118 may be provided at surface portions of the substrate 100 around the gate structure 108. A device isolation pattern 102 may be formed on the field region of the substrate 100 by a device isolation process such as a shallow-trench isolation (STI) process.

The gate structure 108 may include a gate oxide pattern 104 and a gate electrode 106 that may be sequentially stacked on the substrate 100. For example, the gate structure 108 may have a line width of about 10 nm to about 30 nm and a length of about 10 nm to about 30 nm.

The first spacer layer 110 may be arranged on a surface of the substrate 100 and an upper surface and a sidewall of the gate structure 108. The first spacer layer 110 may have a sufficient thickness for a shallow junction when performing an ion implantation process for forming the source/drain extension regions 114. For example, the first spacer layer 110 may have a thickness of about 20 Å to about 50 Å.

The second spacer 112a may be provided on the first spacer layer 110 corresponding to the sidewall of the gate structure 108 and may not be provided on the first spacer layer 110 corresponding to the surface of the substrate 100. The thickness of the first spacer layer 110 plus the second spacer 112a may be varied by a lateral diffusion distance of impurities by which the source/drain extension regions 114 may be formed. The thickness of the first spacer layer 110 plus the second spacer 112a may be more easily determined by the thickness of the second spacer 112a. For example, the second spacer 112a may have a thickness of about 20 Å to about 50 Å.

The third spacer 116 may be provided on the second spacer 112 and may function as a mask pattern for an ion implantation process for forming the source/drain regions 118. The third spacer 116 may have a thickness greater than that of the second spacer 112a.

The source/drain extension region 114 may extend to an edge portion of the gate structure 108 under the first spacer layer 110 and the second spacer 112a. Particularly, an overlap area between the source/drain extension region 114 and the gate structure 108 may be minimized or reduced due to the thickness of the first spacer layer 110 plus the second spacer 112a. In contrast, the source/drain region 118 may be connected to the source/drain extension region 114 aside from the second spacer 112a without any overlapping with the edge portions of the gate structure 108.

Figure 1B:
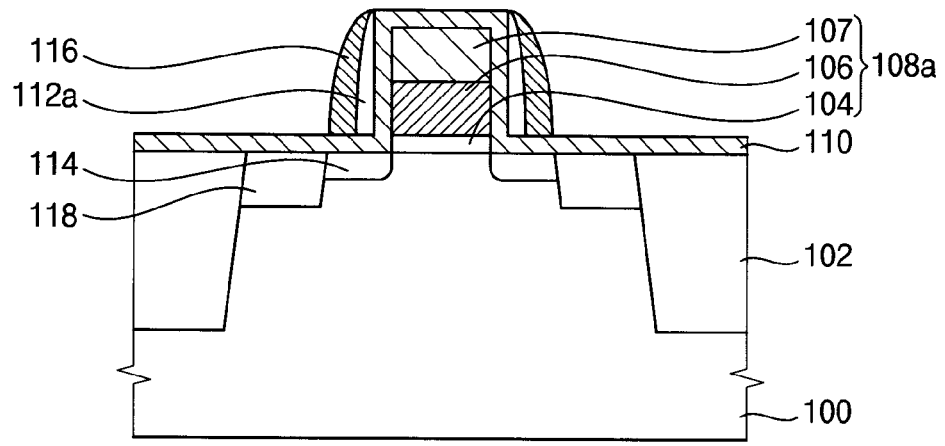
FIG. 1B is a cross-sectional view illustrating a modification of the MOS transistor shown in FIG. 1A.

FIG. 1B is a cross-sectional view illustrating a modification of the MOS transistor shown in FIG. 1A. Referring to FIG. 1B, a modification of the MOS transistor shown in FIG. 1A may include a modified gate structure 108a in which the gate oxide pattern 104, the gate electrode 106 and a hard mask pattern 107 may be sequentially stacked on the substrate 100. The hard mask pattern may comprise a silicon nitride. The first spacer layer 110, the second spacer 112a, the third spacer 116, the source/drain extension regions 114 and the source/drain regions 118 of the modification of the MOS transistor may have the same configuration as those of the MOS transistor shown in FIG. 1A.

Figure 2A:
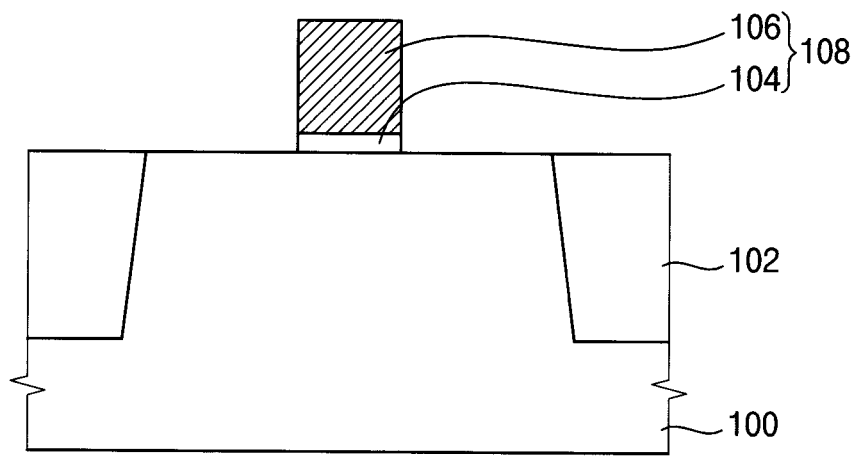
FIGS. 2A to 2G are cross-sectional views illustrating processing steps for a method of manufacturing the MOS transistor shown in FIG. 1A.

FIGS. 2A to 2G are cross-sectional views illustrating processing steps for a method of manufacturing the MOS transistor shown in FIG. 1A. Referring to FIG. 2A, the substrate 100 may include an active region on which conductive structures may be formed and a field region that may define the active region. A device isolation pattern 102 may be formed on the field region of the substrate 100 by a device isolation process such as a shallow-trench isolation (STI) process. For example, the substrate 100 may be etched off into a shallow trench on the field region and the device isolation pattern 102 may be formed in the trench. Thus, the active region of the substrate 100 may be defined by the device isolation pattern 102 of the field region.

A gate oxide layer (not shown) may be formed on the substrate 100 by a thermal oxidation process, and a gate conductive layer (not shown) may be formed on the gate oxide layer. For example, the gate oxide layer may comprise a silicon oxide and the gate conductive layer may comprise polysilicon. Otherwise, the gate conductive layer may include a stack layer in which a polysilicon layer and a conductive layer comprising a metal nitride or a metal may be stacked.

The gate conductive layer and the gate oxide layer may be sequentially and partially removed from the substrate 100, thereby forming the gate structure 108 including the gate oxide pattern 104 and the gate electrode 106. The gate structure 108 may be formed into a line width of about 10 nm to about 30 nm.

In a modified example embodiment, a hard mask pattern 107 comprising silicon nitride may be further formed on the gate electrode 106, as illustrated in FIG. 1B. Thus, the gate structure 108a may be formed into a stack structure in which the gate oxide pattern 104, the gate electrode 106 and the hard mask pattern 107 may be sequentially stacked.

Figure 2B:
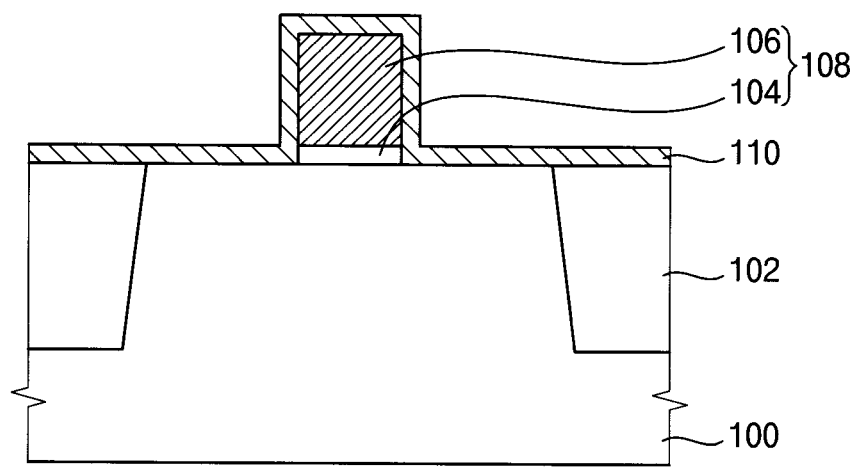

Referring to FIG. 2B, a first spacer layer 110 may be formed on the substrate 100 conformal to the gate structure 108 by a chemical vapor deposition (CVD) process, and thus the first spacer layer 110 may be formed on the surface of the substrate 100 and sidewalls and the upper surface of the gate structure 108. The first spacer layer 110 may comprise an insulation material such as a silicon nitride and a silicon oxide.

When the thickness of the first spacer layer 110 may be over about 50 Å, a subsequent ion implantation process may need a sufficiently high energy for penetrating the first spacer layer 110. In such a case, the impurities may be diffused excessively into the substrate 100 to an unexpected depth over the surface portions of the substrate 100, and thus the impurities may be implanted deep into the substrate 100. Therefore, forming the shallow junction for the source/drain extension regions to be sufficiently shallow for the MOS transistor at the surface portions of the substrate 100 may be difficult.

In contrast, when the thickness of the first spacer layer 110 may be below about 20 Å, the first spacer layer 110 may tend to be etched off in a subsequent etching process for forming the second spacer layer 112a and thus the subsequent ion implantation process may cause damage to the substrate 100. That is, the first spacer layer 110 may be difficult to function as an etch stop layer in the etching process for forming the second spacer 112a, which may cause an inaccurate termination of the etching process. Thus, the second spacer 112a may not be formed on the sidewalls of the gate structure 108 in case that the first spacer layer 110 may be formed to the first thickness less than about 20 Å.

For those reasons, the first spacer layer 110 may be formed to a thickness of about 20 Å to about 50 Å in order that the first spacer layer 110 may function as a sufficient ion blocking mask for a subsequent ion implantation process and may function as the etch stop layer for terminating the etching process for forming the second spacer 112a. Thus, a sufficiently shallow junction may be formed at surface portions of the substrate 100 around the gate structure 108 in an ion implantation process for forming the source/drain extension region 114. In the present example embodiment, the first spacer layer 110 may be formed to a thickness of about 30 Å to about 40 Å.

Figure 2C:
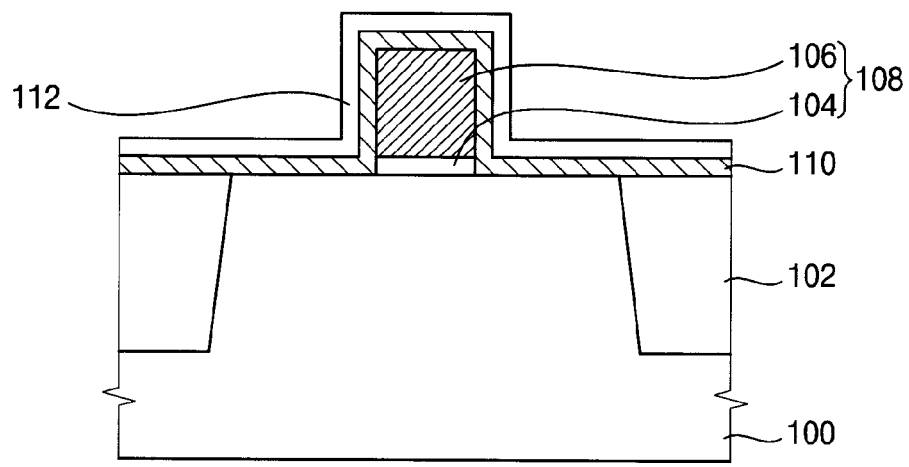

Referring to FIG. 2C, a second spacer layer 112 may be formed on the first spacer layer 110 conformal to the gate structure 108. The second spacer layer 112 may comprise an insulation material having an etching selectivity with respect to the first spacer layer 110. Thus, the second spacer layer 112 may be etched off by an etching process in which the first spacer layer 110 may be scarcely removed from the substrate 100. When the first spacer layer 110 includes a silicon nitride, the second spacer layer 112 may comprise a silicon oxide. Otherwise, when the first spacer layer 110 includes a silicon oxide, the second spacer layer 112 may comprise a silicon nitride.

The second spacer layer 112 may become the second spacer 112a functioning as a mask pattern in a subsequent ion implantation process for forming the source/drain extension regions 114.

Thus, when the second spacer layer 112 may be formed to a thickness over about 50 Å, the impurities may be implanted in the substrate slightly distant from an edge portion of the gate structure 108 and thus the source/drain extension region 114 may be excessively spaced apart from the gate structure 108 as well as not being overlapped with the edge portion of the gate structure 108 even though the implanted impurities may be diffused toward the gate structure 108, which may cause insufficient channel layer under the gate structure 108. In contrast, when the second spacer layer 112 may be formed to a thickness below about 20 Å, the impurities may be implanted in the substrate 100 close to the edge portion of the gate structure 108 and thus the source/drain extension regions 114 may overlap the edge portion of the gate structure 108, which may reduce the effective channel length of the gate structure 108. For those reasons, the second spacer layer 112 may be formed to a thickness of about 20 Å to about 50 Å.

When the gate structure 108 of the MOS transistor may be formed to a width less than about 30 nm, the electrical characteristics of the MOS transistor may be decisively influenced with the overlap area between the source/drain extension region 114 and the gate structure 108. The overlap area between the source/drain extension region and the gate structure 108 may be more easily controlled by the thickness of the second spacer layer 112, and thus the electrical characteristics of the MOS transistor may be efficiently controlled by the thickness of the second spacer layer 112.

Figure 2D:
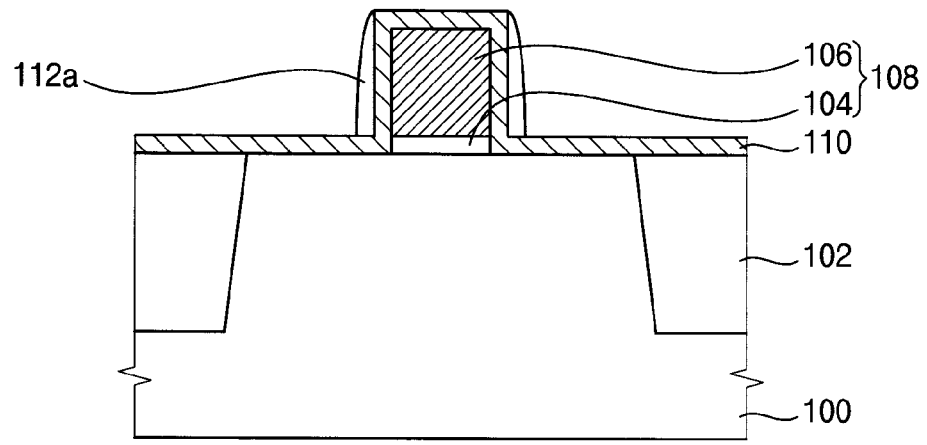

Referring to FIG. 2D, the second spacer layer 112 may be removed from the first spacer layer 110 by an anisotropic etching process, and thus the second spacer layer 112 may remain on the first spacer layer 110 corresponding to the sidewall of the gate structure 108, thereby forming the second spacer 112a along the sidewall of the gate structure 108. The first spacer layer 110 on the surface of the substrate 100 and on the upper surface of the gate structure 108 may be exposed by the anisotropic etching process.

The second spacer layer 112 along the sidewall of the gate structure 108 may be scarcely etched off by the anisotropic etching process, and thus the second spacer 112a may be formed to the second thickness of about 20 Å to about 50 Å.

The anisotropic etching process may be performed for a sufficient time until the second spacer layer 112 may be sufficiently removed from the upper surface of the gate structure 108 and from the surface of the substrate 100.

Otherwise, the anisotropic etching process may be maintained to an etch stop point where the first spacer layer 110 may be exposed. That is, the first spacer layer 110 may function as an etch stop layer for the anisotropic etching process.

The gate structure 108, the first spacer layer 110 and the second spacer 112a may function as an implantation mask for a subsequent ion implantation process. Thus, the total thickness of the first spacer layer 110 and the second spacer 112a that may be stacked on the sidewall of the gate structure 108 may determine the size of the source/drain extension region. Accordingly, the overlap area between the source/drain extension region 114 and the gate structure 108 may also be determined by the total thickness of the first spacer layer 110 and the second spacer 112a. In addition, the total thickness of the first spacer layer 110 and the second spacer 112a may be varied by a deposition thickness of the second spacer layer 112.

For example, the second spacer layer 112 may be formed to a sufficient thickness by a deposition process in such a way that the total thickness of the first spacer layer 110 and the second spacer 112a may be substantially the same as the lateral diffusion length of the impurities toward the gate structure 108. In such a case, the source/drain extension region 114 may make contact with the edge portion of the gate structure 108, and thus, no overlap area may be formed between the source/drain extension region 114 and the gate structure 108.

Figure 2E:
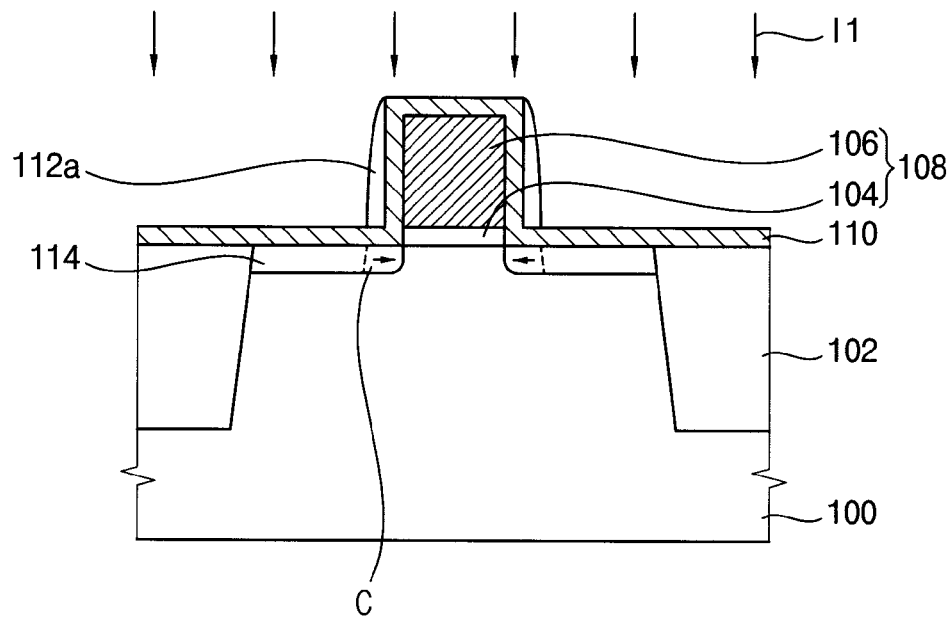

Referring to FIG. 2E, a first ion implantation process I1 may be performed on the substrate 100 using the gate structure 108 including the first spacer layer 110 and the second spacer 112a as an implantation mask, thereby forming a lightly doped junction at surface portions of the substrate 100 around the gate structure 108 as the source/drain extension region 114.

In the above implantation process of the impurities in the surface of the substrate 100, the impurities may also be laterally diffused from an implantation portion to a covered portion C (or an non-implantation portion) of the substrate 100, which may be covered with the first spacer layer 110 and the second spacer 112a, toward the gate structure 108, as indicated by an arrow mark in FIG. 2E. That is, the lightly doped junction may be extended to the covered portion C of the substrate 100 by the lateral diffusion to thereby enlarge the source/drain extension region 114. In such a case, because both of the first spacer layer 110 and the second spacer 112a may function as the ion implantation mask, the implantation portion of the substrate 100 may be sufficiently apart from the edge portion of the gate structure 108. Thus, the source/drain extension region 114 may not overlap the edge portion of the gate structure 108 even though the impurities may be laterally diffused to the covered portion C to thereby prevent or inhibit the reduction of the channel length due to the overlap area between the source/drain extension region 114 and the gate structure 108. Particularly, when the impurities are diffused laterally for a relatively long distance toward the gate structure 108, the increase of the thickness of the second spacer 112a may sufficiently prevent or inhibit the increase of the overlap area between the source/drain extension region 114 and the gate structure 108.

Accordingly, the overlap size between the source/drain extension region 114 and the gate structure 108 may be more easily reduced by the thickness of the second spacer 112a, thereby increasing the effective channel length of the MOS transistor. Further, a gate-induced drain leakage (GIDL) and an overlap capacitor may be sufficiently minimized or reduced in the MOS transistor because of the minimization or reduction of the overlap size.

In general, the thickness increase of the conventional spacer for forming the source/drain extension region around the gate structure requires the thickness increase of the spacer layer for forming the conventional spacer, which usually prevents or inhibits the shallow junction in a subsequent ion implantation process. However, according to an example embodiment of the present inventive concepts, the first spacer layer 110 may be formed on the surface of the substrate 100 around the gate structure 108. Thus, the second spacer 112a may be formed to a greater thickness without any thickness increase of the first spacer layer 110 on the surface of the substrate 100 around the gate structure 108, and thus the thickness of the second spacer 112a may be sufficiently increased without deteriorating the shallow junction for the source/drain extension region 114 in a subsequent ion implantation process.

In the present example embodiment, the first spacer layer 110 may be formed to a thickness of about 20 Å to about 50 Å, and thus, the first spacer layer 110 may function as a sufficient ion blocking mask. Therefore, a shallow junction may be formed at the surface portions of the substrate 100 around the gate structure 108 as the source/drain extension region 114.

Figure 2F:
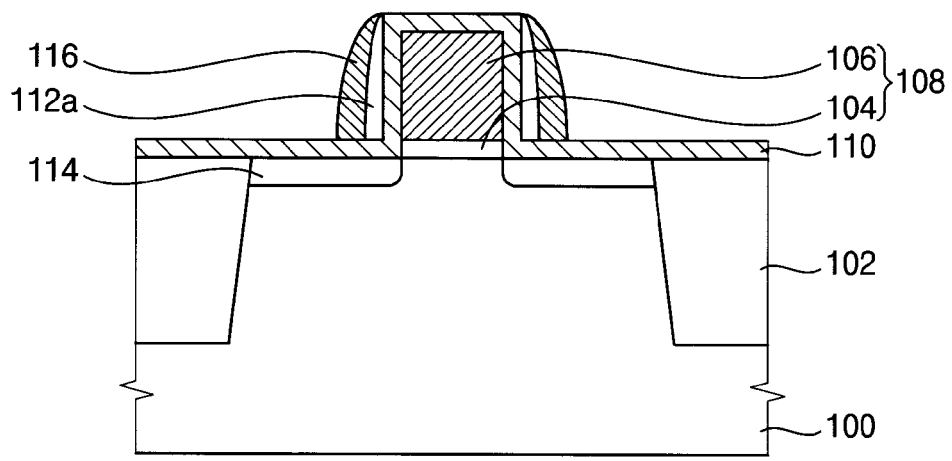

Referring to FIG. 2F, a third spacer layer (not illustrated) may be formed on the first spacer layer 110 and the second spacer 112a conformal with the gate structure 108 by a deposition process. For example, the third spacer layer may comprise an insulation material such as silicon nitride and silicon oxide.

The third spacer layer may be partially removed from the substrate 100 by an isotropic etching process, thereby form a third spacer 116 on the second spacer 112a corresponding to the sidewall of the gate structure 108. Thus, the first spacer layer 110, the second spacer 112a and the third spacer 116 may be sequentially stacked on the sidewall of the gate structure 108.

Figure 2G:
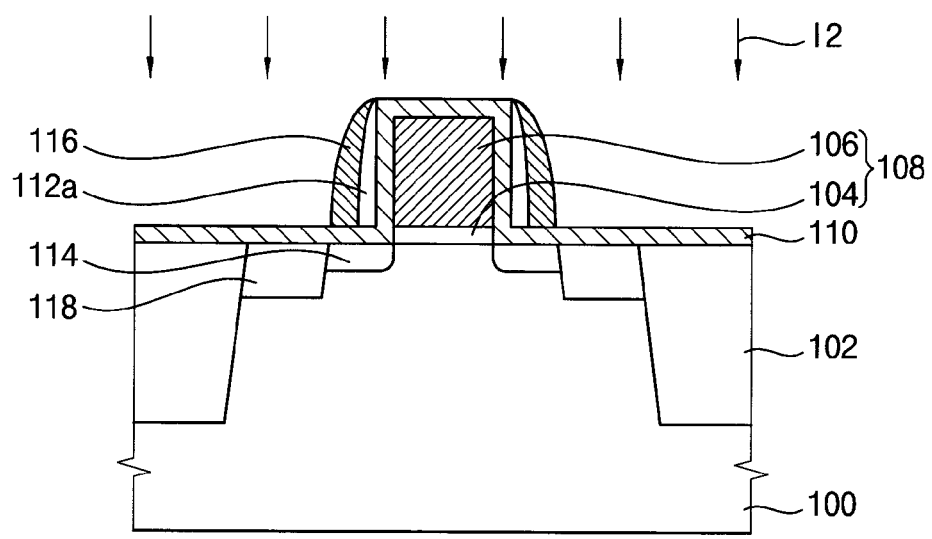

Referring to FIG. 2G, a second ion implantation process I2 may be performed on the substrate 100 using the gate structure 108 including the first spacer layer 110, the second spacer 112a and the third spacer 116 as an implantation mask, thereby forming a heavily doped junction at surface portions of the substrate 100 around the gate structure 108 as the source/drain region 118. In the present example embodiment, the source/drain region 118 may partially overlap with the source/drain extension region 114.

According to the above example embodiment, the overlap size between the source/drain extension region 114 and the gate structure may be minimized or reduced and thus the effective channel length of the gate structure 108 may not be shortened by the lateral diffusion of the impurities to thereby improve the short channel effect in the MOS transistor. In addition, the GIDL and the overlap capacitance may also be reduced in the MOS transistor. Furthermore, the source/drain extension region 114 may be formed to have a shallow junction in spite of the increase of the thickness of the ion implantation mask.

Embodiment II

Figure 3A:
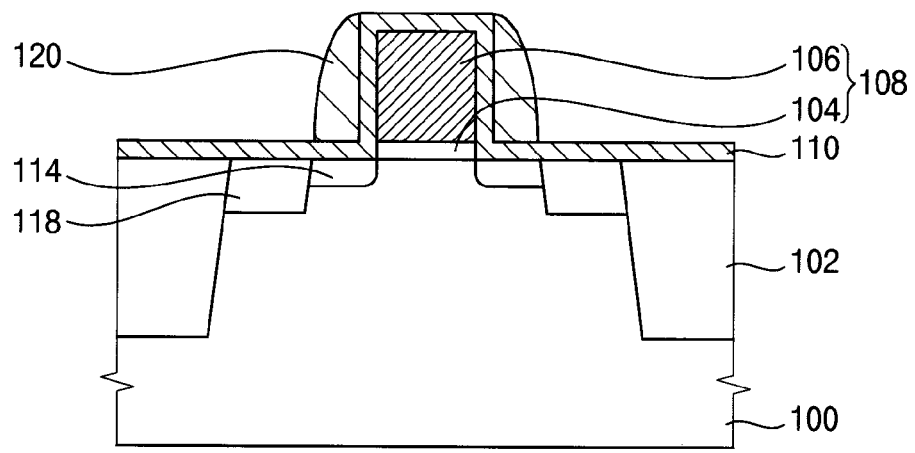
FIG. 3A is a cross-sectional view illustrating a MOS transistor in accordance with another example embodiment of the present inventive concepts.

FIG. 3A is a cross-sectional view illustrating a MOS transistor in accordance with an example embodiment of the present inventive concepts. The MOS transistor in embodiment II has substantially the same structure as the MOS transistor in embodiment I except that the first spacer layer and the third spacer are positioned on the sidewall of the gate structure without the second spacer. Thus, in FIG. 3, the same reference numerals denote the same elements in FIG. 1.

Referring to FIG. 3A, a MOS transistor in accordance with an example embodiment of the present inventive concepts may include a semiconductor substrate 100 and a gate structure 108, a first spacer layer 110 and a third spacer 120 on the substrate 100. Source/drain extension regions 114 and source/drain regions 118 may be provided at surface portions of the substrate 100 around the gate structure 108. A device isolation pattern 102 may be formed on the field region of the substrate 100 by a device isolation process such as a shallow-trench isolation (STI) process.

The gate structure 108 may include a gate oxide pattern 104 and a gate electrode 106 that may be sequentially stacked on the substrate 100. For example, the gate structure 108 may have a line width of about 10 nm to about 30 nm.

The first spacer layer 110 may be arranged on a surface of the substrate 100 and an upper surface and a sidewall of the gate structure 108. The first spacer layer 110 may have a sufficient thickness for a shallow junction when performing an ion implantation process for forming the source/drain extension regions 114. For example, the first spacer layer 110 may have a first thickness of about 20 Å to about 50 Å.

The third spacer 120 may be provided on the first spacer layer 110 and may function as a mask pattern for an ion implantation process for forming the source/drain regions 118. The third spacer 120 may comprise an insulation material that may be substantially the same as or different from that of the first spacer layer 110.

The source/drain extension region 114 may extend to an edge portion of the gate structure 108 under the first spacer layer 110 and the third spacer 116. Particularly, an overlap area between the source/drain extension region 114 and the gate structure 108 may be minimized or reduced due to the thickness of the first spacer layer 110 plus the third spacer 120.

In contrast, the source/drain region 118 may be connected to the source/drain extension region 114 without any overlapping with the edge portions of the gate structure 108.

Figure 3B:
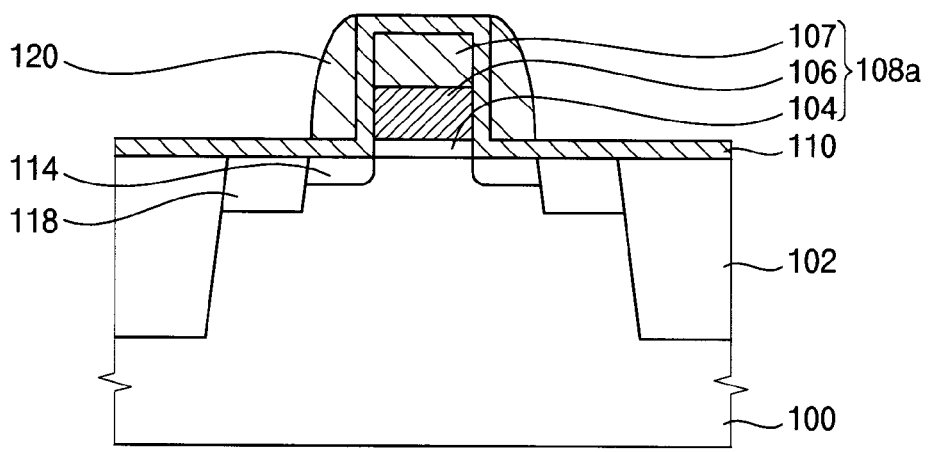
FIG. 3B is a cross-sectional view illustrating a modification of the MOS transistor shown in FIG. 3A.

FIG. 3B is a cross-sectional view illustrating a modification of the MOS transistor shown in FIG. 3A. Referring to FIG. 3B, a modification of the MOS transistor shown in FIG. 3A may include a modified gate structure 108a in which the gate oxide pattern 104, the gate electrode 106 and a hard mask pattern 107 may be sequentially stacked on the substrate 100. The hard mask pattern 107 may comprise nitrogen, e.g., a silicon nitride. The first spacer layer 110, the third spacer 120, the source/drain extension region 114 and the source/drain region 118 of the modification of the MOS transistor may have the same configuration as those of the MOS transistor shown in FIG. 3A.

Figure 4A:
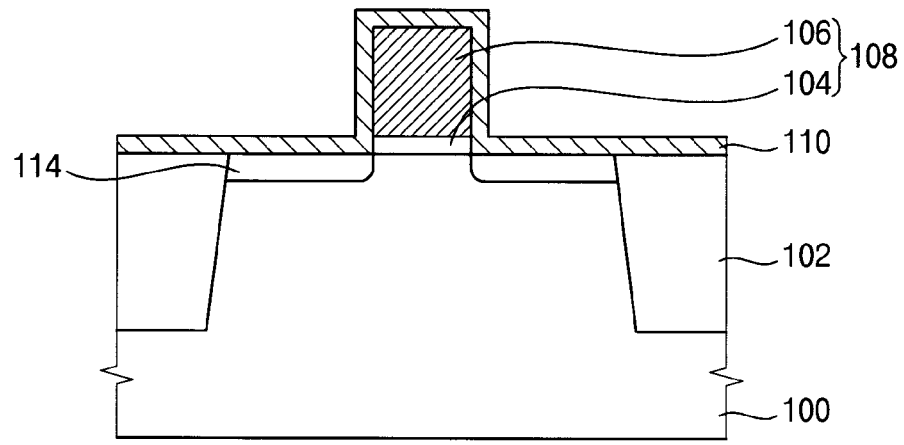
FIGS. 4A to 4C are cross-sectional views illustrating processing steps for a method of manufacturing the MOS transistor shown in FIG. 3A.
Figure 4B:
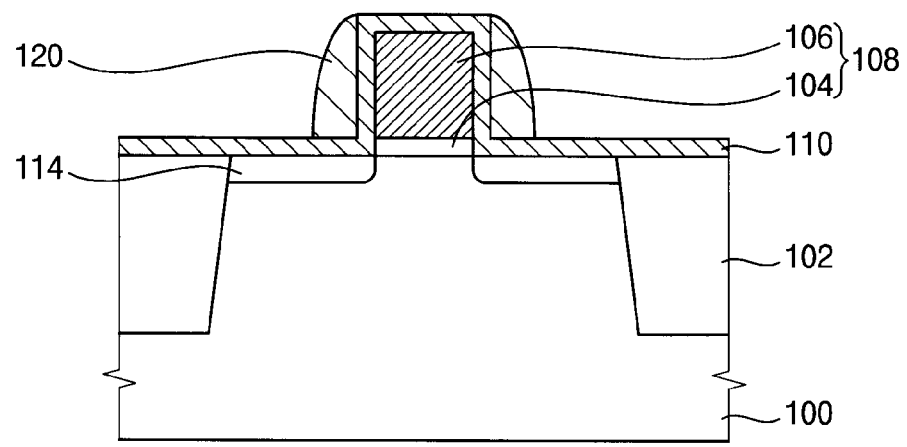
Figure 4C:
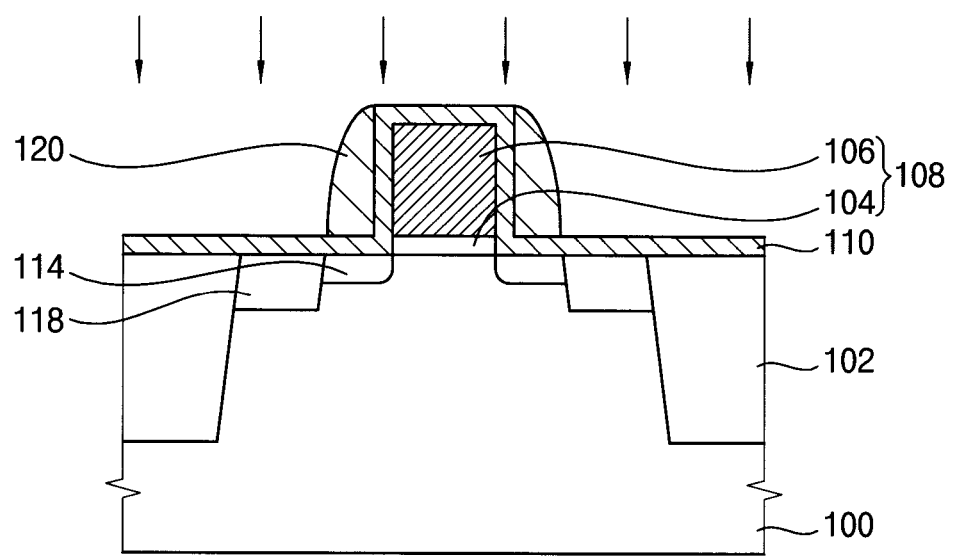

FIGS. 4A to 4C are cross-sectional views illustrating processing steps for a method of manufacturing the MOS transistor shown in FIG. 3A. The same structure as illustrated in FIG. 2E may be formed by the same process as described in detail with reference to FIGS. 2A to 2E. Thus, the gate structure 108 and the source/drain extension region 114 may be formed on the substrate 100 and the source/drain extension region 114 may be formed as the shallow junction by an ion implantation process.

Thereafter, the second spacer 112a in FIG. 2E may be removed from the first spacer layer 110 as illustrated in FIG. 4A. That is, the second spacer 112a may function as a dummy spacer for forming the source/drain extension region 114.

Referring to FIG. 4B, a third spacer layer (not illustrated) may be formed on the first spacer layer 110 conformal with the gate structure 108 by a deposition process. For example, the third spacer layer may comprise an insulation material such as silicon nitride and silicon oxide. In the present example embodiment, the third spacer layer may be formed into a thickness greater than that of the second spacer 112a.

Then, the third spacer layer may be partially removed from the substrate 100 by an isotropic etching process to thereby form a third spacer 120 on the first spacer layer 110 corresponding to the sidewall of the gate structure 108. Thus, the first spacer layer 110 and the third spacer 120 may be sequentially stacked on the sidewall of the gate structure 108.

Referring to FIG. 4C, an ion implantation process may be performed on the substrate 100 using the gate structure 108 including the first spacer layer 110 and third spacer 120 as an implantation mask, thereby forming the source/drain region 118 around the gate structure 108. In the present example embodiment, the source/drain region 118 may partially overlap with the source/drain extension region 114.

Embodiment III

Figure 5A:
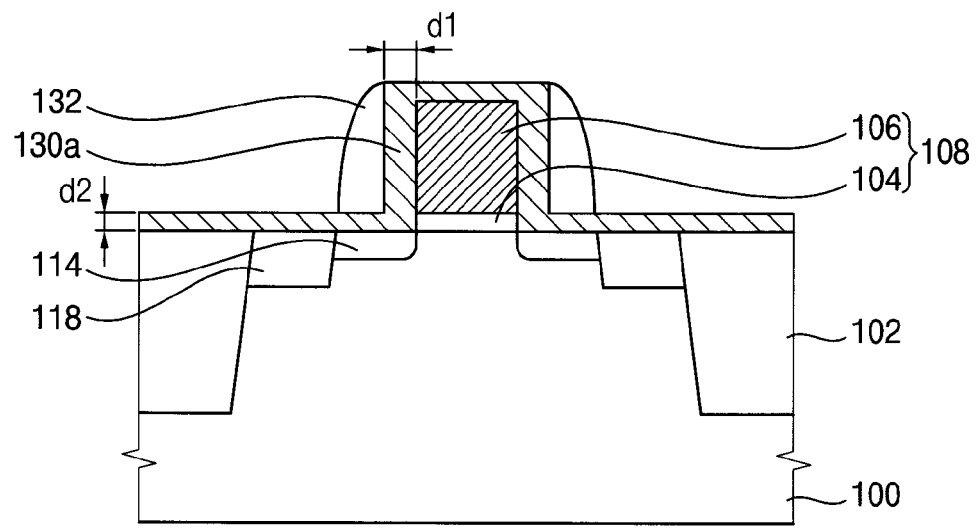
FIG. 5A is a cross-sectional view illustrating a MOS transistor in accordance with another example embodiment of the present inventive concepts.

FIG. 5A is a cross-sectional view illustrating a MOS transistor in accordance with an example embodiment of the present inventive concepts. Referring to FIG. 5A, a MOS transistor in accordance with an example embodiment of the present inventive concepts may include a semiconductor substrate 100 and a gate structure 108, a first spacer layer 130a and a second spacer 132 on the substrate 100. Source/drain extension regions 114 and source/drain regions 118 may be provided at surface portions of the substrate 100 around the gate structure 108. A device isolation pattern 102 may be formed on the field region of the substrate 100 by a device isolation process such as a shallow-trench isolation (STI) process.

The gate structure 108 may include a gate oxide pattern 104 and a gate electrode 106 that may be sequentially stacked on the substrate 100. For example, the gate structure 108 may have a line width of about 10 nm to about 30 nm.

The first spacer layer 130a may be arranged on a surface of the substrate 100 conformal with the gate structure 108 and have a non-uniform thickness. That is, the first spacer layer 130a may have a first thickness d1 that may be measured from the sidewall of the gate structure 108 and may have a second thickness d2 that may be measured from an upper surface of the gate structure 108 and from a surface of the substrate 100. In the present example embodiment, the first thickness d2 may be smaller than the first thickness d1.

The first spacer layer 130a on the sidewall of the gate structure 108 may function as an ion implantation mask in an ion implantation process for forming the source/drain extension region 114. Thus, the first thickness d1 may be in a range of about 40 Å to about 100 Å in view of the minimization or reduction of the overlap size between the gate structure 108 and the source/drain extension region 114. In contrast, the first spacer layer 130a on the surface of the substrate 100 may function as a buffer layer for forming a shallow junction at the surface portion of the substrate 100, and thus, the second thickness d2 may be in a range of about 20 Å to about 50 Å.

The second spacer 132 may be provided on the first spacer layer 130a corresponding to the sidewall of the gate structure 108 and may function as a mask pattern for an ion implantation process for forming the source/drain region 118. The second spacer 132 may comprise an insulation material that may be substantially the same as or different from that of the first spacer layer 130a.

The source/drain extension region 114 may extend to an edge portion of the gate structure 108 under the first spacer layer 130a and the second spacer 132. Particularly, an overlap area between the source/drain extension region 114 and the gate structure 108 may be minimized or reduced due to the thickness of the first spacer layer 130a plus the second spacer 132.

In contrast, the source/drain region 118 may be connected to the source/drain extension region 114 without any overlapping with the edge portions of the gate structure 108.

Figure 5B:
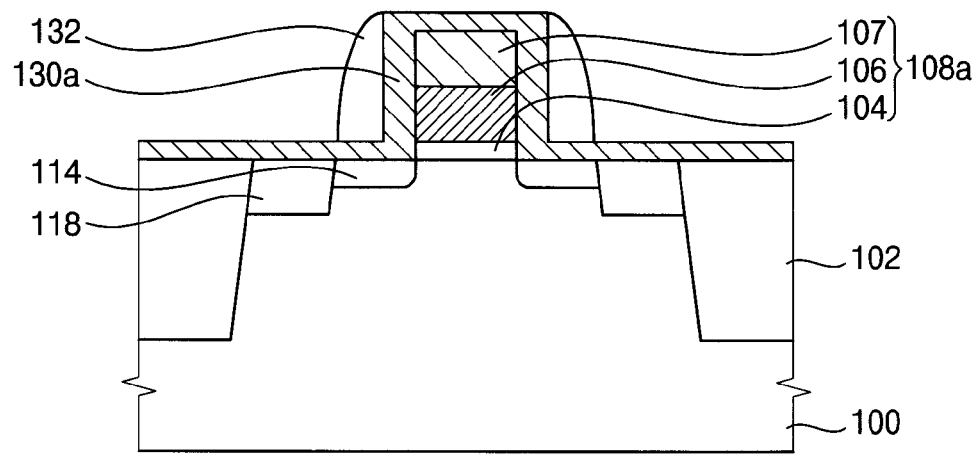
FIG. 5B is a cross-sectional view illustrating a modification of the MOS transistor shown in FIG. 5A.

FIG. 5B is a cross-sectional view illustrating a modification of the MOS transistor shown in FIG. 5A. Referring to FIG. 5B, a modification of the MOS transistor shown in FIG. 5A may include a modified gate structure 108a in which the gate oxide pattern 104, the gate electrode 106 and a hard mask pattern 107 may be sequentially stacked on the substrate 100. The hard mask pattern 107 may comprise a silicon nitride. The first spacer layer 130a, the second spacer 132, the source/drain extension region 114 and the source/drain region 118 of the modification of the MOS transistor may have the same configuration as those of the MOS transistor shown in FIG. 5A.

FIGS. 6A to 6D are cross-sectional views illustrating processing steps for a method of manufacturing the MOS transistor shown in FIG. 5A. For example, the gate structure 108 may be formed on the substrate 100 in the same process as described with reference to FIG. 2A. Thereafter, the following processing steps may be performed on the substrate 100 including the gate structure 108.

Figure 6A:
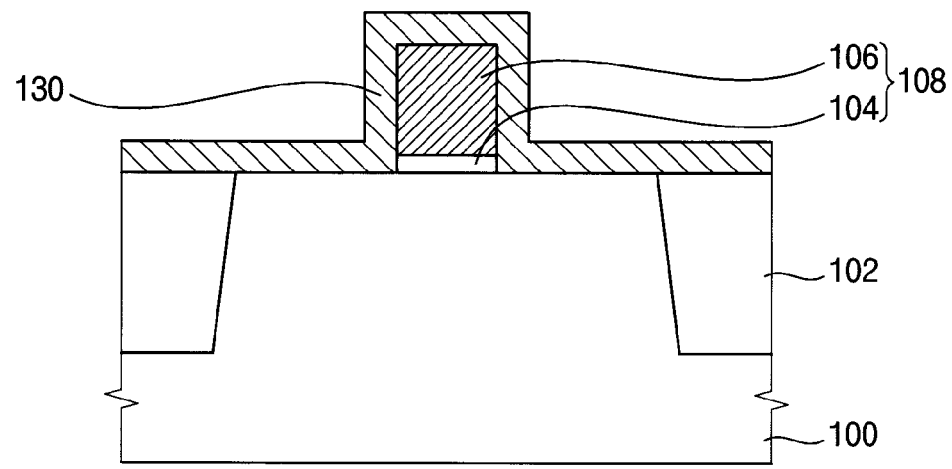
FIGS. 6A to 6D are cross-sectional views illustrating processing steps for a method of manufacturing the MOS transistor shown in FIG. 5A.

Referring to FIG. 6A, a first preliminary spacer layer 130 may be formed on the substrate 100 conformal to the gate structure 108 by a chemical vapor deposition (CVD) process, and thus the first preliminary spacer layer 130 may be formed on the surface of the substrate 100 and sidewalls and the upper surface of the gate structure 108. The first spacer layer 130 may comprise an insulation material such as silicon nitride.

The first preliminary spacer layer 130 may function as an ion implantation mask in a subsequent ion implantation process for forming the source/drain extension region 114 around the gate structure 108. Thus, the first preliminary spacer layer 130 may be formed on the substrate 100 in such a way that the thickness of the first preliminary spacer layer 130 may be greater than the lateral diffusion distance of the impurities.

When the first preliminary spacer layer 130 may be formed to a thickness over about 100 Å the impurities may be implanted in the substrate 100 slightly distant from an edge portion of the gate structure 108 and thus the source/drain extension region 114 may be spaced apart from the gate structure 108 as well as not overlapping the edge portion of the gate structure 108 even though the implanted impurities may be diffused toward the gate structure 108, which may result in an insufficient channel layer under the gate structure 108. In contrast, when the first preliminary spacer layer 130 may be formed to a thickness below about 40 Å, the impurities may be implanted in the substrate 100 close to the edge portion of the gate structure 108 and thus the source drain extension regions 114 may overlap the edge portion of the gate structure 108, which may reduce the effective channel length of the gate structure 108. For those reasons, the first preliminary spacer layer 130 may be formed to a thickness of about 40 Å to about 100 Å.

Figure 6B:
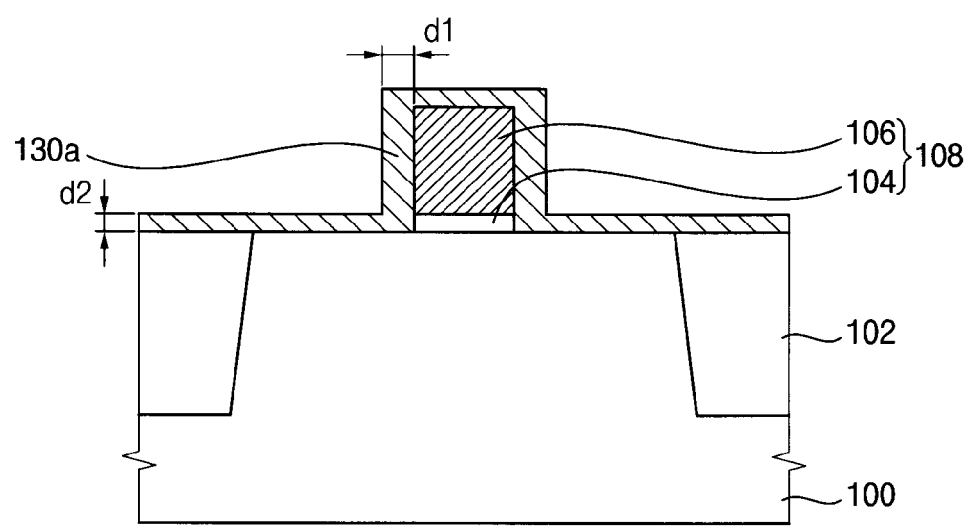

Referring to FIG. 6B, the first preliminary spacer layer 130 may be partially removed from the substrate 100 by an anisotropic etching process in such a way that the first preliminary spacer layer 130 on the surface of the substrate 100 and on the gate structure 108 may be more etched off than the first preliminary spacer layer 130 on the sidewall of the gate structure 108 thereby forming the first spacer layer 130a having a first thickness d1 and a second thickness d2 smaller than the first thickness d1. Particularly, the first spacer layer 130a may have the first thickness d1 along the sidewall of the gate structure 108 and the second thickness d2 along the surface of the substrate 100 and along the upper surface of the gate structure 108.

For example, the preliminary first spacer layer 130 on the sidewall of the gate structure 108 may be scarcely etched off while the preliminary first spacer layer 130 on the surface of the substrate 100 and on the upper surface of the gate structure 108 may be sufficiently etched off. Thus, most of the first preliminary spacer layer 130 may remain on the sidewall of the gate structure 108 and the first spacer layer 130a may have substantially the same thickness as the first preliminary spacer layer 130, for example, in a range of about 40 Å to about 100 Å. In contrast, the first preliminary spacer layer 130 may be sufficiently etched off from the surface of the substrate 100 and from the upper surface of the gate structure 108, and thus, may be formed to a thickness of about 20 Å to about 50 Å. Therefore, a shallow junction may be formed at the surface portions of the substrate 100 around the gate structure 108 in a subsequent ion implantation process for forming the source/drain extension region 114.

Figure 6C:
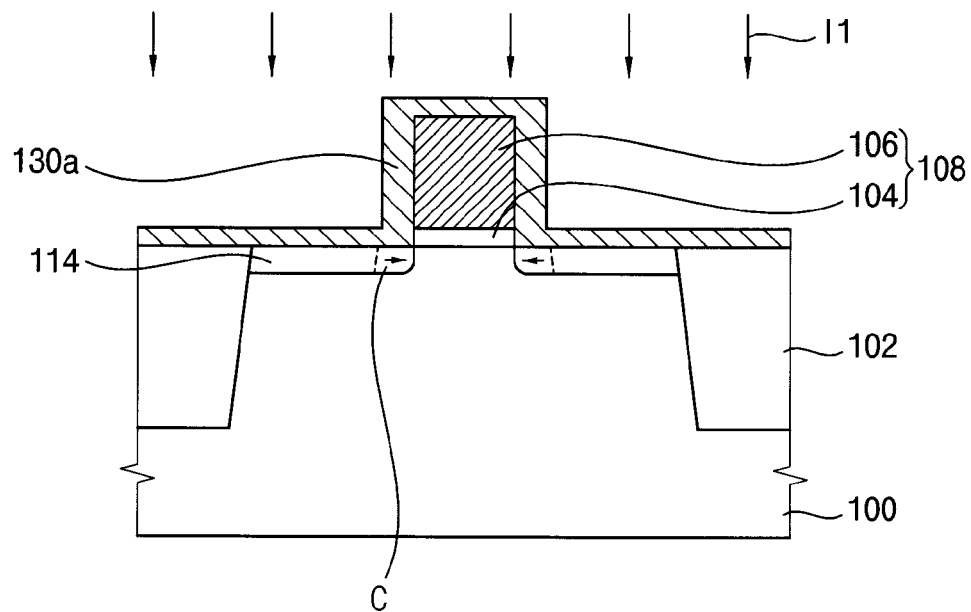

Referring to FIG. 6C, a first ion implantation process I1 may be performed on the substrate 100 using the gate structure 108 including the first spacer layer 130a as an implantation mask, thereby forming a lightly doped junction at surface portions of the substrate 100 around the gate structure 108 as the source/drain extension region 114.

In the above implantation process of the impurities in the surface of the substrate 100, the impurities may also be laterally diffused from an implantation portion to a covered portion C (or an non-implantation portion) of the substrate 100, which may be covered with the first spacer layer 130a, toward the gate structure 108, as indicated by an arrow mark in FIG. 6C. That is, the lightly doped junction may be extended to the covered portion C of the substrate 100 by the lateral diffusion, thereby enlarging the source/drain extension region 114.

In such a case, because the first spacer layer 130a that may be positioned on the sidewall of the gate structure 108 and may have the first thickness d1 greater than the second thickness d2 may function as the ion implantation mask, the implantation portion of the substrate 100 may be sufficiently apart from the edge portion of the gate structure 108. Thus, the source/drain extension region 114 may not overlap the edge portion of the gate structure 108 even though the impurities may be laterally diffused to the covered portion C, thereby preventing or inhibiting the reduction of the channel length due to the overlap area between the source/drain extension region 114 and the gate structure 108. Accordingly, the overlap size between the source/drain extension region 114 and the gate structure 108 may be more easily reduced by the first thickness d1 of the first spacer layer 130a, thereby more easily increasing the effective channel length of the MOS transistor. Further, a gate-induced drain leakage (GIDL) and an overlap capacitor may be sufficiently minimized or reduced in the MOS transistor because of the minimization or reduction of the overlap size.

In addition, the first spacer layer 130a may be formed to the second thickness d2 of about 20 Å to about 50 Å on the surface of the substrate 100, and thus the first spacer layer 130a may function as a sufficient ion blocking mask. Therefore, a shallow junction may be formed at the surface portions around the gate structure 108 as the source/drain extension region 114.

Figure 6D:
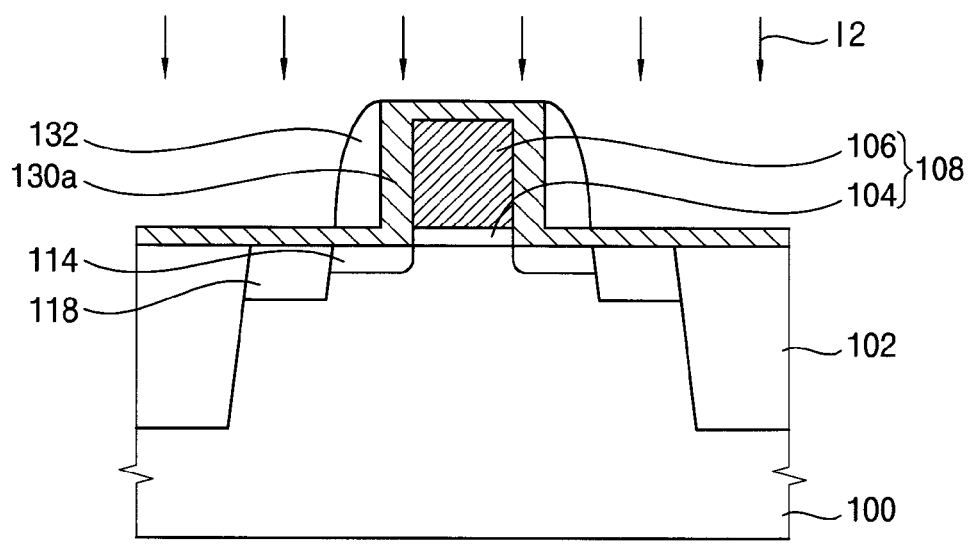

Referring to FIG. 6D, a second spacer 132 may be formed on the first spacer layer 130a corresponding to the sidewall of the gate structure 108 and a source/drain region 118 may be formed at the surface portions of the substrate 100 around the gate structure 108.

For example, a second spacer layer (not illustrated) may be formed on the first spacer layer 130a conformal with the gate structure 108 by a deposition process. For example, the second spacer layer may comprise an insulation material such as silicon nitride and silicon oxide. The second spacer layer may comprise the same material as the first spacer layer 130a or may comprise a material different from the first spacer layer 130a.

The second spacer layer may be partially removed from the substrate 100 by an isotropic etching process, thereby forming a second spacer 132 on the first spacer layer 130a corresponding to the sidewall of the gate structure 108. Thus, the first spacer layer 130a and the second spacer 132 may be sequentially stacked on the sidewall of the gate structure 108.

Thereafter, a second ion implantation process I2 may be performed on the substrate 100 using the gate structure 108 including the first spacer layer 130a and the second spacer 132 as an implantation mask, thereby forming a heavily doped junction at surface portions of the substrate 100 around the gate structure 108 as the source/drain region 118. In the present example embodiment, the source/drain region 118 may partially overlap with the source/drain extension region 114.

According to the above example embodiment, the overlap size between the source/drain extension region 114 and the gate structure may be minimized or reduced, and thus, the effective channel length of the gate structure 108 may not be shortened by the lateral diffusion of the impurities, thereby improving the short channel effect in the MOS transistor. Further, the GIDL and the overlap capacitance may also be reduced in the MOS transistor. Furthermore, the source/drain extension region 114 may be formed to have a shallow junction in spite of the increase of the thickness of the ion implantation mask.

Embodiment IV

Figure 7:
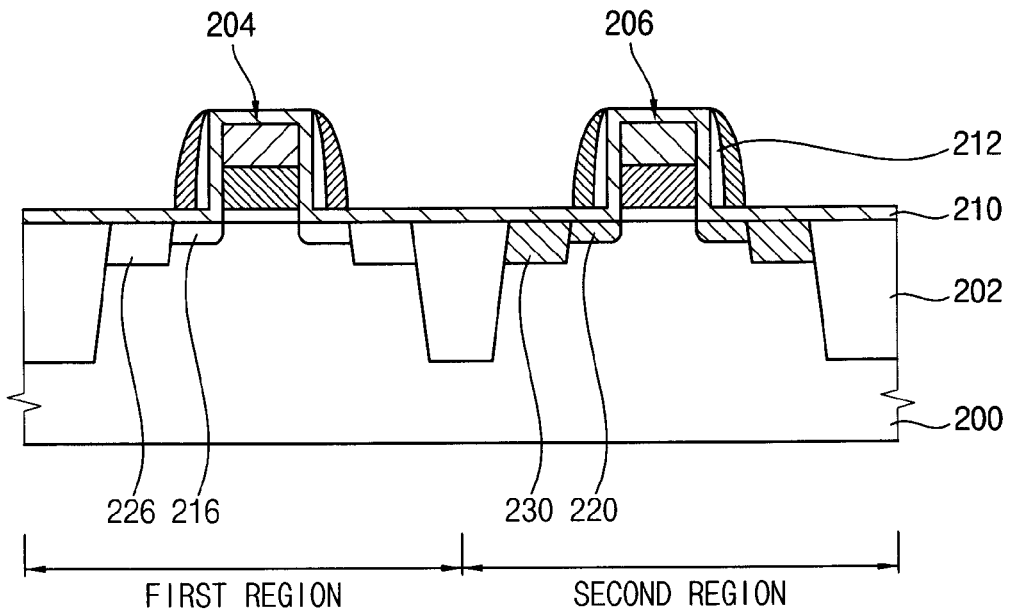
FIG. 7 is a cross-sectional view illustrating a CMOS transistor in accordance with another example embodiment of the present inventive concepts.

FIG. 7 is a cross-sectional view illustrating a CMOS transistor in accordance with another example embodiment of the present inventive concepts. Referring to FIG. 7, a CMOS transistor in accordance with another example embodiment of the present inventive concepts may include an NMOS transistor and a PMOS transistor both of which may have the same structure as the MOS transistor shown in FIG. 1, except that both of the NMOS transistor and the PMOS transistor may include a hard mask pattern on each of the gate structures. Thus, any detailed descriptions on the structures of the NMOS transistor and PMOS transistor will be omitted.

Referring to FIG. 7, a device isolation pattern 202 may be formed on a semiconductor substrate 200. The substrate 200 may include a first region in which the NMOS transistor may be provided through subsequent processes and a second region in which the PMOS transistor may be provided through subsequent processes.

A first spacer layer 210 may be formed on the substrate 200 conformal to the first and the second gate structures 204 and 206. A second spacer layer (not shown) may be formed on the first spacer layer 210 conformal to the first and the second gate structures 204 and 206, and etched off by an etching process in which the first spacer layer 210 may be scarcely removed from the substrate 100. Thus, the second spacer layer may be formed into the second spacer 212 functioning as a mask pattern in a subsequent ion implantation process for forming the source/drain extension regions.

In particular, a first N-type ion implantation process may be performed on the substrate 200, thereby forming a lightly N-type doped junction at surface portions of the substrate 200 around the first gate structure 204 as an N-type source/drain extension region 216. Furthermore, a second N-type ion implantation process may be performed on the substrate 200, thereby forming a heavily N-type doped junction at surface portions of the substrate 200 around the first gate structure 204 as an N-type source/drain region 226.

In addition, a first P-type ion implantation process may be performed on the substrate 200, thereby forming a lightly P-type doped junction at surface portions of the substrate 200 around the second gate structure 206 as a P-type source/drain extension region 220. Finally, a second P-type ion implantation process may be performed on the substrate 200, thereby forming a heavily P-type doped junction at surface portions of the substrate 200 around the second gate structure 206 as a P-type source/drain region 230.

Figure 8A:
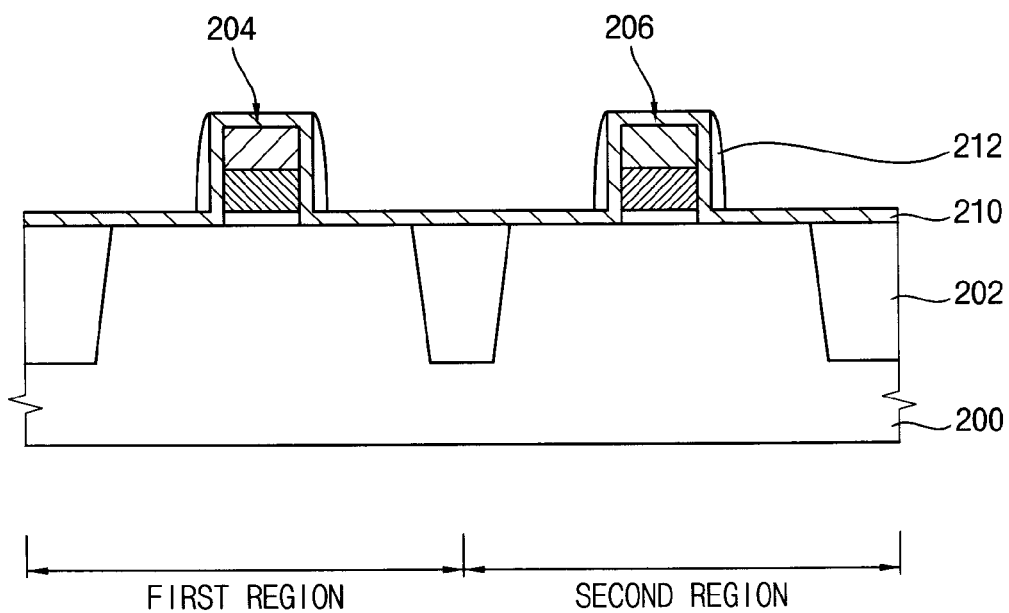
FIGS. 8A to 8E are cross-sectional views illustrating process steps for a method of manufacturing the CMOS transistor shown in FIG. 7.

FIGS. 8A to 8E are cross-sectional views illustrating process steps for a method of manufacturing the CMOS transistor shown in FIG. 7. Referring to FIG. 8A, a device isolation pattern 202 may be formed on a semiconductor substrate 200 by a device isolation process such as a shallow trench isolation (STI) process. The substrate 200 may include a first region in which the NMOS transistor may be provided through subsequent processes and a second region in which the PMOS transistor may be provided through subsequent processes.

A gate oxide layer, a gate conductive layer and a hard mask layer may be formed on the semiconductor substrate 200. The hard mask layer, the gate conductive layer and the gate oxide layer may be sequentially patterned into a first gate structure 204 for the NMOS transistor and a second gate structure 206 for the PMOS transistor on the substrate 200. The line widths the first and the second gate structures 204 and 206 may be in a range of about 10 nm to about 30 nm.

A first spacer layer 210 may be formed on the substrate 200 conformal to the first and the second gate structures 204 and 206 by a chemical vapor deposition (CVD) process, and thus, the first spacer layer 210 may be formed on the surface of the substrate 200 and sidewalls and the upper surface of the first and the second gate structures 204 and 206. The first spacer layer 210 may comprise an insulation material such as a silicon nitride and a silicon oxide.

The first spacer layer 210 may be formed to a thickness of about 20 Å to about 50 Å and thus the first spacer layer 210 may function as a sufficient ion blocking mask for a subsequent ion implantation process. Thus, a shallow junction may be formed at surface portions of the substrate 200 around the first and the second gate structures 204 and 206 in an ion implantation process for forming the source/drain extension region.

A second spacer layer (not shown) may be formed on the first spacer layer 210 conformal to the first and the second gate structures 204 and 206. The second spacer layer may comprise an insulation material having an etching selectivity with respect to the first spacer layer 210. Thus, the second spacer layer may be etched off by an etching process in which the first spacer layer 210 may be scarcely removed from the substrate 100. The second spacer layer may be formed into the second spacer 212 functioning as a mask pattern in a subsequent ion implantation process for forming source; drain extension regions. For example, the second spacer layer may be formed to a thickness of about 20 Å to about 50 Å.

The second spacer layer may be removed from the first spacer layer 210 by an anisotropic etching process, and thus the second spacer layer may remain on the first spacer layer 210 corresponding to the sidewall of the first and the second gate structures 204 and 206, thereby forming the second spacer 212 along the sidewall of the first and the second gate structures 204 and 206. The first spacer layer 210 on the surface of the substrate 200 and on the upper surface of the first and the second gate structures 204 and 206 may be exposed by the anisotropic etching process. For example, the second spacer 212 may be formed to a thickness of about 20 Å to about 50 Å.

Figure 8B:
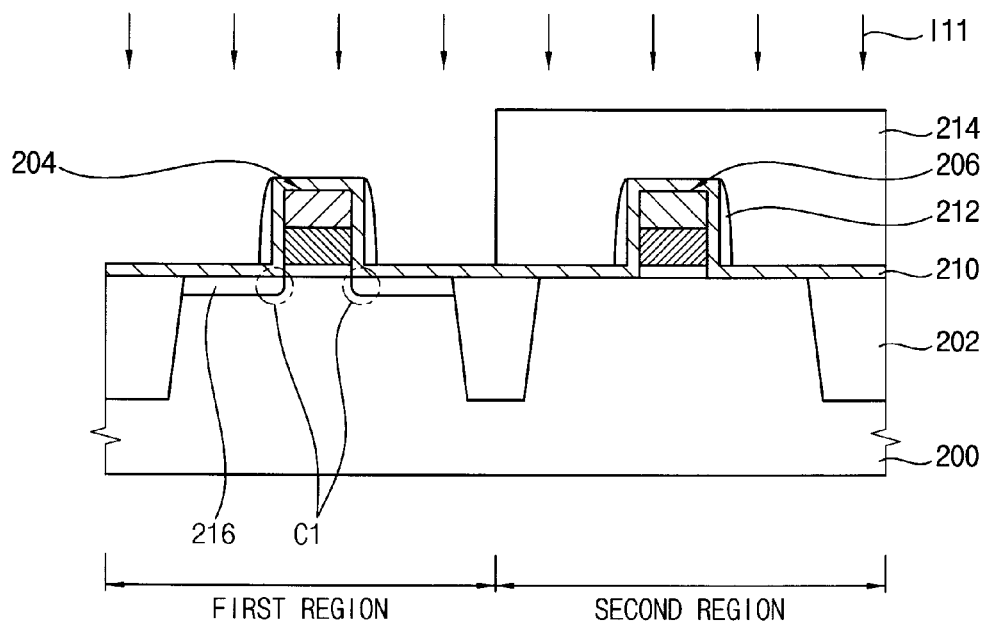

Referring to FIG. 8B, a first mask pattern 214 may be formed on the second region of the substrate 200 in such a way that the second gate structure 206 may be covered with the first mask pattern 214. A first N-type ion implantation process I11 may be performed on the substrate 200 using the first gate structure 204 including the first spacer layer 210 and the second spacer 212 as an implantation mask, thereby forming a lightly N-type doped junction at surface portions of the substrate 200 around the first gate structure 204 as an N-type source/drain extension region 216. The first mask pattern 214 may be removed from the substrate 200.

In the above implantation process of the N-type impurities in the surface of the substrate 200, the N-type impurities may also be laterally diffused from an implantation portion to a first covered portion C1 (or an non-implantation portion) of the substrate 200, which may be covered with the first spacer layer 210 and the second spacer 212 toward the first gate structure 204. That is, the lightly N-type doped junction may be extended to the first covered portion C1 of the substrate 200 by the lateral diffusion, thereby enlarging the N-type source/drain extension region 216. In such a case, because both the first spacer layer 210 and the second spacer 212 may function as the ion implantation mask, the implantation portion of the substrate 200 may be sufficiently apart from the edge portion of the first gate structure 204. Thus, the N-type source/drain extension region 216 may not overlap the edge portion of the first gate structure 204 even though the N-type impurities may be laterally diffused to the first covered portion C1, thereby preventing or inhibiting the reduction of the channel length due to the overlap area between the N-type source/drain extension region 216 and the first gate structure 204. Particularly, when the N-type impurities may be diffused laterally for a relatively long distance toward the first gate structure 204, the increase of the thickness of the second spacer 212 may sufficiently prevent or inhibit the increase of the overlap area between the N-type source/drain extension region 216 and the first gate structure 204.

Accordingly, the overlap size between the N-type source/drain extension region 216 and the first gate structure 204 may be more easily reduced by the thickness of the second spacer 212, thereby increasing the effective channel length of the NMOS transistor. Further, a gate-induced drain leakage (GIDL) and an overlap capacitor may be sufficiently minimized or reduced in the NMOS transistor because of the minimization or reduction of the overlap size.

Figure 8C:
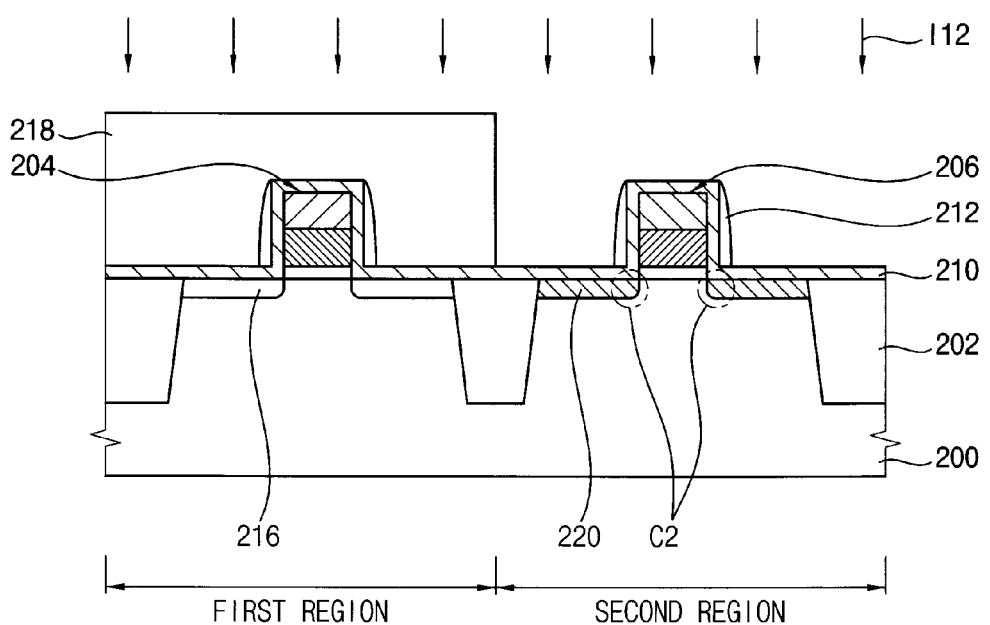

Referring to FIG. 8C, a second mask pattern 218 may be formed on the first region of the substrate 200 in such a way that the first gate structure 204 may be covered with the second mask pattern 218. A first P-type ion implantation process I12 may be performed on the substrate 200 using the second gate structure 206 including the first spacer layer 210 and the second spacer 212 as an implantation mask, thereby forming a lightly P-type doped junction at surface portions of the substrate 200 around the second gate structure 206 as a P-type source/drain extension region 220. The second mask pattern 218 may be removed from the substrate 200.

In the above implantation process of the P-type impurities in the surface of the substrate 200, the P-type impurities may also be laterally diffused from an implantation portion to a second covered portion C2 (or an non-implantation portion) of the substrate 200, which may be covered with the first spacer layer 210 and the second spacer 212 toward the second gate structure 206. That is, the lightly P-type doped junction may be extended to the second covered portion C2 of the substrate 200 by lateral diffusion, thereby enlarging the P-type source/drain extension region 220. In such a case, because both the first spacer layer 210 and the second spacer 212 may function as the ion implantation mask, the implantation portion of the substrate 200 may be sufficiently apart from the edge portion of the second gate structure 206. Thus, the P-type source/drain extension region 220 may not overlap the edge portion of the second gate structure 206 even though the P-type impurities may be laterally diffused to the second covered portion C2, thereby preventing or inhibiting the reduction of the channel length due to the overlap area between the P-type source/drain extension region 220 and the second gate structure 206. Particularly, when the P-type impurities may be diffused laterally for a relatively long distance toward the second gate structure 206, the increase of the thickness of the second spacer 212 may sufficiently prevent or inhibit the increase of the overlap area between the P-type source/drain extension region 220 and the second gate structure 206.

Accordingly, the overlap size between the P-type source/drain extension region 220 and the second gate structure 206 may be more easily reduced by the thickness of the second spacer 212, thereby increasing the effective channel length of the PMOS transistor. Further, a gate-induced drain leakage (GIDL) and an overlap capacitor may be sufficiently minimized or reduced in the PMOS transistor because of the minimization or reduction of the overlap size.

While the example embodiment discloses that the N-type source/drain extension region 216 may be formed prior to the P-type source/drain extension region 220, the P-type source/drain extension region 220 would also be formed prior to the N-type source/drain extension region 216.

Figure 8D:
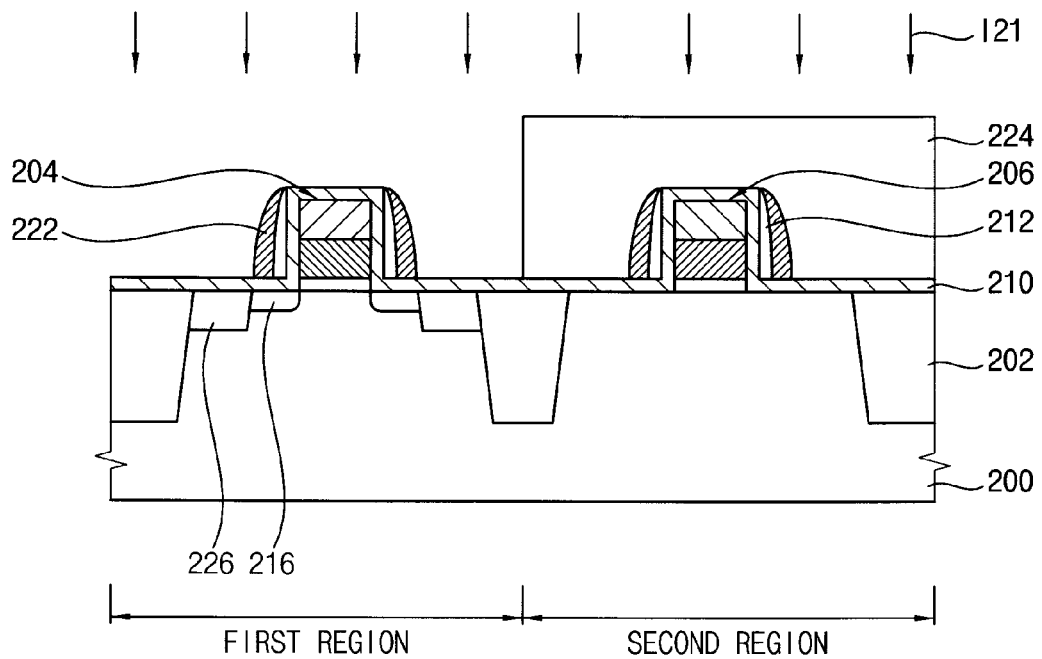

Referring to FIG. 8D, a third spacer layer (not illustrated) may be formed on the first spacer layer 110 and the second spacer 112a conformal with the gate structure 108 by a deposition process. For example, the third spacer layer may comprise an insulation material such as silicon nitride and silicon oxide.

Then, the third spacer layer may be partially removed from the substrate 200 by an isotropic etching process, thereby forming a third spacer 222 on the second spacer 212 corresponding to the sidewall of the first and the second gate structures 204 and 206. Thus, the first spacer layer 210, the second spacer 212 and the third spacer 222 may be sequentially stacked on the sidewall of the first and the second gate structures 204 and 206.

A third mask pattern 224 may be formed on the second region of the substrate 200 in such a way that the second gate structure 206 including the first spacer layer 210, the second spacer 212 and the third spacer 222 may be covered with the third mask pattern 224.

A second N-type ion implantation process I21 may be performed on the substrate 200 using the first gate structure 204 including the first spacer layer 210, the second spacer 212 and the third spacer 222 as an implantation mask, thereby forming a heavily N-type doped junction at surface portions of the substrate 200 around the first gate structure 204 as an N-type source/drain region 226. The third mask pattern 224 may be removed from the substrate 200. In the present example embodiment, the N-type source/drain region 226 may partially overlap the N-type source/drain extension region 216.

Figure 8E:
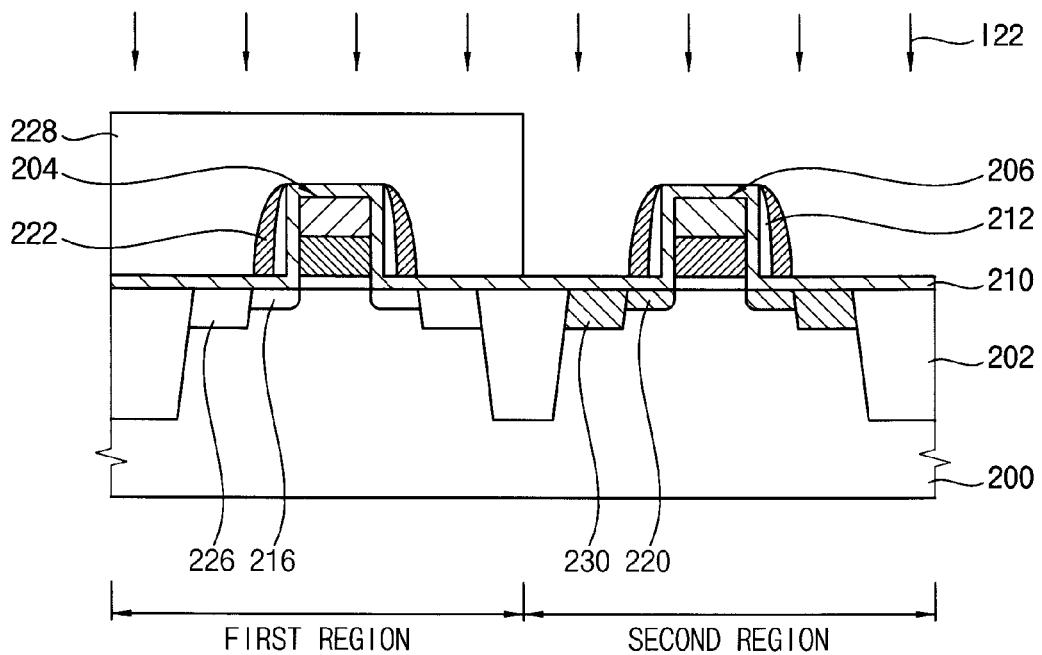

Referring to FIG. 8E, a fourth mask pattern 228 may be formed on the first region of the substrate 200 in such a way that the first gate structure 204 including the first spacer layer 210, the second spacer 212 and the third spacer 222 may be covered with the fourth mask pattern 228.

A second P-type ion implantation process I22 may be performed on the substrate 200 using the second gate structure 206 including the first spacer layer 210, the second spacer 212 and the third spacer 222 as an implantation mask, thereby forming a heavily P-type doped junction at surface portions of the substrate 200 around the second gate structure 206 as a P-type source/drain region 230. The fourth mask pattern 228 may be removed from the substrate 200.

While the present example embodiment discloses that the N-type source/drain extension region 216 may be formed prior to the P-type source/drain extension region 220, the P-type source/drain extension region 220 would also be formed prior to the N-type source/drain extension region 216. In the present example embodiment, the P-type source/drain region 230 may partially overlap with the P-type source/drain extension region 220.

While the present example embodiment discloses that the N-type source/drain region 226 may be formed prior to the P-type source/drain region 230, the P-type source/drain region 230 would also be formed prior to the N-type source/drain region 226.

According to the above example embodiment, the overlap size between the source/drain extension region and the gate structure may be minimized or reduced at each of the NMOS transistor and the PMOS transistor, and thus, the effective channel length of each gate structure may not be shortened by the lateral diffusion of the impurities, thereby improving the short channel effect in the CMOS transistor. Further, the GIDL and the overlap capacitance may also be reduced in each of the NMOS and the PMOS transistor. Furthermore, the source; drain extension region may be formed to have a shallow junction in spite of the increase of the thickness of the ion implantation mask. Accordingly, the electrical characteristics of the CMOS transistor may be sufficiently improved in spite of the high degree of the integration of the CMOS transistor.

Figure 9A:
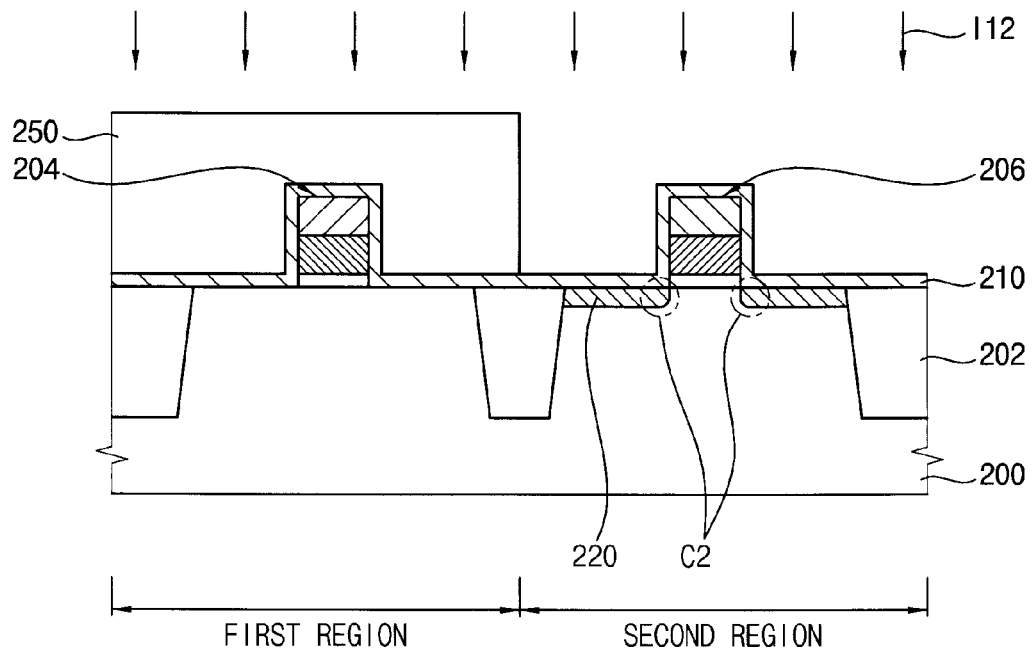
FIGS. 9A to 9C are cross-sectional views illustrating other process steps for a method of manufacturing the CMOS transistor shown in FIG. 7.
Figure 9B:
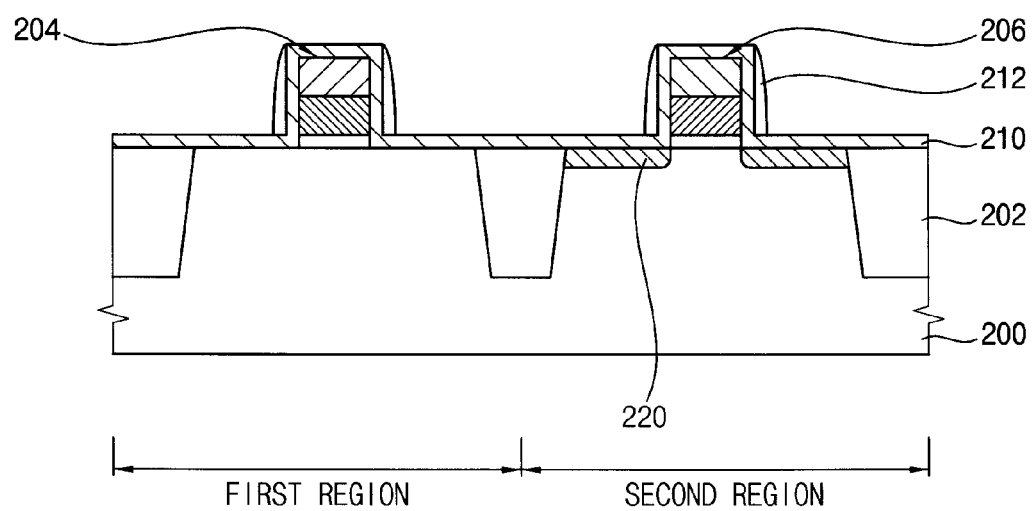
Figure 9C:
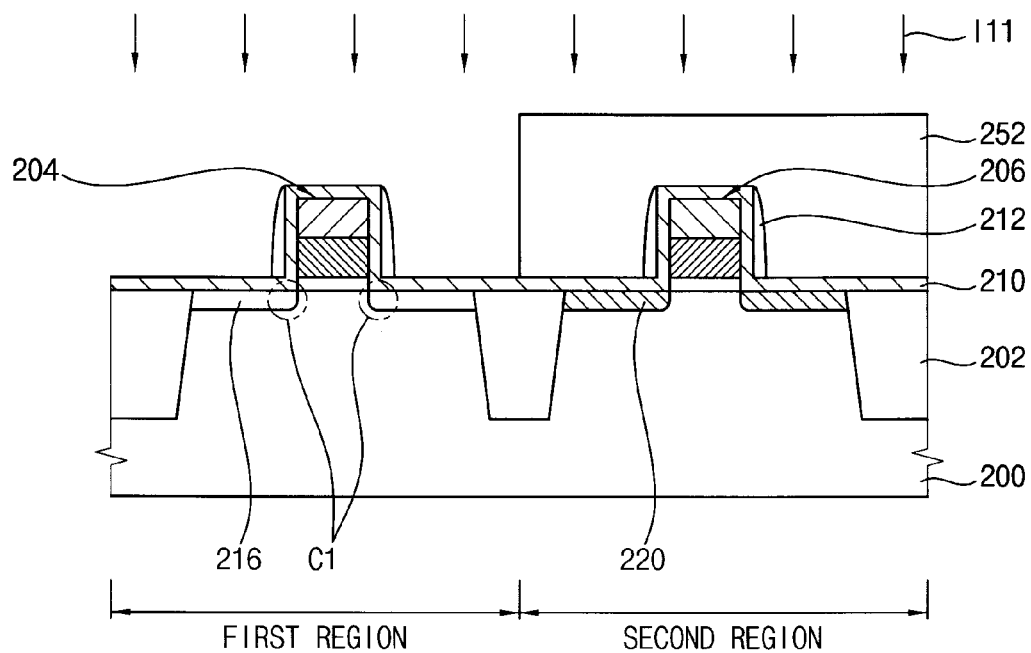

FIGS. 9A to 9C are cross-sectional views illustrating other process steps for a method of manufacturing the CMOS transistor shown in FIG. 7. Referring to FIG. 9A, a device isolation pattern 202 may be formed on a semiconductor substrate 200 by a device isolation process such as a shallow trench isolation (STI) process. The substrate 200 may include a first region in which an NMOS transistor may be provided through subsequent processes and a second region in which a PMOS transistor may be provided through subsequent processes. A first gate structure 204 for the NMOS transistor may be formed in the first region of the substrate 200 and a second gate structure 206 for the PMOS transistor may be formed in the second region of the substrate 200. The line widths the first and the second gate structures 204 and 206 may be in a range of about 10 nm to about 30 nm. A first spacer layer 210 may be formed on the substrate 200 conformal to the first and the second gate structures 204 and 206 by a chemical vapor deposition (CVD) process. The first spacer layer 210 may be formed to a thickness of about 20 Å to about 50 Å, and thus, the first spacer layer 210 may function as a sufficient ion blocking mask for a subsequent ion implantation process. Thus, a shallow junction may be formed at surface portions of the substrate 200 around the first and the second gate structures 204 and 206 in an ion implantation process for forming the source/drain extension region.

A first mask pattern 250 may be formed on the first region of the substrate 200 in such a way that the first gate structure 204 may be covered with the first mask pattern 250. A first P-type ion implantation process I12 may be performed on the substrate 200 using the second gate structure 206 including the first spacer layer 210 as an implantation mask, thereby forming a lightly P-type doped junction at surface portions of the substrate 200 around the second gate structure 206 as a P-type source/drain extension region 220. When the lateral diffusion distance of the P-type impurities may be shorter than that of the N-type impurities, the first P-type ion implantation process I12 may be performed just merely using the first spacer layer 210 as an implantation mask without the second spacer 212, as compared with the processing steps described with reference to FIG. 8C. The first mask pattern 250 may be removed from the substrate 200 as shown in FIG. 9B.

In the above implantation process of the P-type impurities in the surface of the substrate 200, the P-type impurities may also be laterally diffused from an implantation portion to a second covered portion C2 (or an non-implantation portion) of the substrate 200, which may be covered with the first spacer layer 210, toward the second gate structure 206. That is, the lightly P-type doped junction may be extended to the second covered portion C2 of the substrate 200 by the lateral diffusion, to thereby enlarge the P-type source/drain extension region 220. In the present example embodiment, even though just the first spacer layer 210 may function as the ion implantation mask, the P-type source/drain extension region 220 may not overlap the edge portion of the second gate structure 206 because the P-type impurities may be laterally diffused to the second covered portion C2 smaller than N-type impurities, thereby sufficiently preventing or inhibiting the reduction of the channel length of the PMOS transistor. Accordingly, the overlap size between the P-type source/drain extension region 220 and the second gate structure 206 may be more easily reduced by the thickness of the first spacer layer 210. Further, a gate-induced drain leakage (GIDL) and an overlap capacitor may be sufficiently minimized or reduced in the PMOS transistor because of the minimization or reduction of the overlap size.

Referring to FIG. 9B, a second spacer layer (not shown) may be formed on the first spacer layer 210 conformal to the first and the second gate structures 204 and 206. For example, the second spacer layer may be formed to a thickness of about 20 Å to about 50 Å.

The second spacer layer may be removed from the first spacer layer 210 by an anisotropic etching process, and thus the second spacer layer may remain on the first spacer layer 210 corresponding to the sidewall of the first and the second gate structures 204 and 206, thereby forming second spacers 212 along the sidewall of the first and the second gate structures 204 and 206. The first spacer layer 210 on the surface of the substrate 200 and on the upper surface of the first and the second gate structures 204 and 206 may be exposed by the anisotropic etching process. For example, the second spacer 212 may be formed to a thickness of about 20 Å to about 50 Å.

Referring to FIG. 9C, a second mask pattern 252 may be formed on the second region of the substrate 200 in such a way that the second gate structure 206 may be covered with the second mask pattern 252. A first N-type ion implantation process I11 may be performed on the substrate 200 using the first gate structure 204 including the first spacer layer 210 and the second spacer 212 as an implantation mask, thereby forming a lightly N-type doped junction at surface portions of the substrate 200 around the first gate structure 204 as an N-type source/drain extension region 216. The second mask pattern 252 may be removed from the substrate 200.

In the above implantation process of the N-type impurities in the surface of the substrate 200, the N-type impurities may also be laterally diffused from an implantation portion to a first covered portion C1 (or an non-implantation portion) of the substrate 200, which may be covered with the first spacer layer 210 and the second spacer 212 toward the first gate structure 204. That is, the lightly N-type doped junction may be extended to the first covered portion C1 of the substrate 200 by the lateral diffusion, to thereby enlarge the N-type source/drain extension region 216. In such a case, because both the first spacer layer 210 and the second spacer 212 may function as the ion implantation mask, the implantation portion of the substrate 200 may be sufficiently apart from the edge portion of the first gate structure 204. Thus, the N-type source/drain extension region 216 may not overlap the edge portion of the first gate structure 204 even though the N-type impurities may be laterally diffused to the first covered portion C1 thereby preventing or inhibiting the reduction of the channel length of the NMOS transistor. Particularly, when the N-type impurities may be diffused laterally for a relatively long distance toward the first gate structure 204, the increase of the thickness of the second spacer 212 may sufficiently prevent or inhibit the increase of the overlap area between the N-type source/drain extension region 216 and the first gate structure 204. Accordingly, the overlap size between the N-type source/drain extension region 216 and the first gate structure 204 may be more easily reduced by the thickness of the second spacer 212, thereby increasing the effective channel length of the NMOS transistor. Further, a gate-induced drain leakage (GIDL) and an overlap capacitor may be sufficiently minimized or reduced in the NMOS transistor because of the minimization or reduction of the overlap size.

Thereafter, the same processes as described with reference to FIGS. 8D and 8E may be performed on the resultant structure shown in FIG. 9C, to thereby complete the CMOS transistor shown in FIG. 7.

According to the above example embodiment, the P-type source/drain extension region and the gate structure of the PMOS transistor may be sufficiently prevented or inhibited from being overlapped with each other even though just the first spacer layer may be provided on the sidewall of the gate structure. The overlap size between the source/drain extension region and the gate structure may be minimized or reduced at each of the NMOS transistor and the PMOS transistor. Thus, the effective channel length of each gate structure may not be shortened by the lateral diffusion of the impurities, thereby improving the short channel effect in the CMOS transistor. Further, the GIDL and the overlap capacitance may also be reduced in each of the NMOS and the PMOS transistor. Furthermore, the source/drain extension region may be formed to have a shallow junction in spite of the increase of the thickness of the ion implantation mask. Accordingly, the electrical characteristics of the CMOS transistor may be sufficiently improved in spite of the high degree of the integration of the CMOS transistor.

Experimental Results

Experiments on Short Channel Effect

A group of sample NMOS transistors were manufactured through the same processes as described with reference to FIGS. 2A to 2G. The sample transistors had the channel length of about 20 nm to about 500 nm and the line width of about 1400 nm.

In each of the sample transistors, the first spacer layer of the sample transistor was formed to a thickness of about 20 Å and included silicon nitride. The second spacer layer was formed to a thickness of about 20 Å and included silicon oxide. The second spacer layer was partially etched off by an anisotropic etching process, thereby forming the second spacer on the first spacer layer corresponding to the sidewall of the gate structure of the sample NMOS transistor. An ion implantation process was performed on the substrate using the first spacer layer and the second spacer as the ion implantation mask, thereby forming the source/drain extension region around the gate structure of the sample transistor.

A group of comparative NMOS transistors were manufactured through the conventional processes. The comparative transistors also had the channel length of about 20 nm to about 500 nm and the line width of about 1400 nm.

In each of the comparative transistors, just the first spacer layer was provided with the gate structure without the second spacer. The first spacer of the comparative transistor was formed to a thickness of about 20 Å and included silicon nitride. The second spacer was not provided with the comparative transistor. Thus, an ion implantation process was performed on the substrate using the first spacer layer as the ion implantation mask, thereby forming the conventional source/drain extension region around the gate structure of the comparative transistor.

Figure 10:
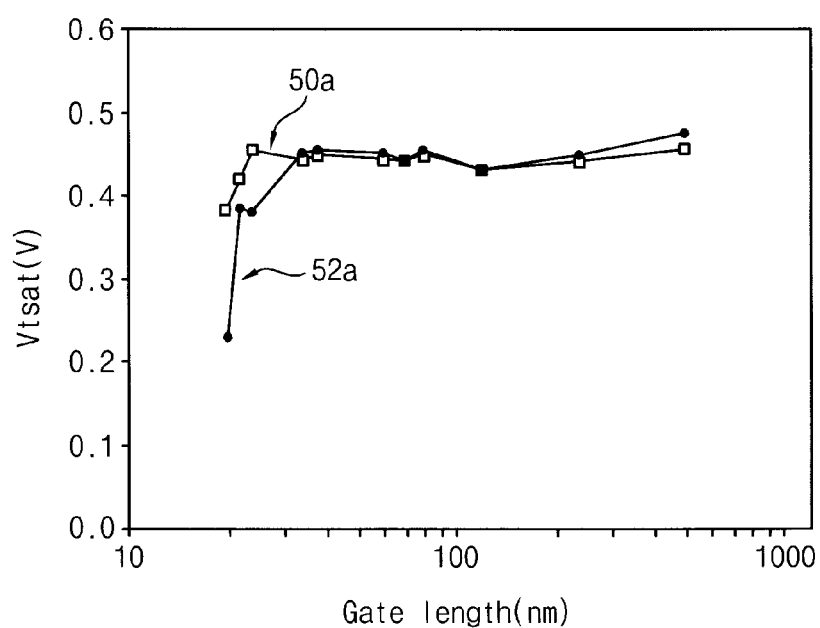
FIG. 10 is a graph showing a relation between a threshold voltage and a channel length of the sample transistors and the comparative transistors.

FIG. 10 is a graph showing a relation between a threshold voltage and a channel length of the sample transistors and the comparative transistors. In FIG. 10, the reference numeral 50a denotes a graph showing the relation between the threshold voltage and the channel length of the sample transistors and the reference numeral 52a denotes a graph showing the relation between the threshold voltage and the channel length of the comparative transistors.

Referring to FIG. 10, when the channel length was over about 30 nm, the threshold voltage of the sample transistor was similar to that of the comparative transistor. However, when the channel length was below about 30 nm as is usual in a highly integrated MOS transistor, the threshold voltage was not deteriorated in the sample transistor while showing a drop in the comparative transistor.

Accordingly, the experimental results in FIG. 10 indicate that the short channel effect may be generated less in the MOS transistor according to the present inventive concepts, especially when the channel length of the MOS transistor may be less than about 30 nm.

Experiments on Current Leakage

A group of sample NMOS transistors were manufactured through the same processes as described with reference to FIGS. 2A to 2G. The sample transistors had the channel length of about 20 nm and the line width of about 1400 nm.

In each of the sample transistors, the first spacer layer of the sample transistor was formed to a thickness of about 20 Å and included silicon nitride. The second spacer layer was formed to a thickness of about 20 Å and included silicon oxide. The second spacer layer was partially etched off by an anisotropic etching process, thereby forming the second spacer on the first spacer layer corresponding to the sidewall of the gate structure of the sample NMOS transistor. An ion implantation process was performed on the substrate using the first spacer layer and the second spacer as the ion implantation mask, thereby forming the source/drain extension region around the gate structure of the sample transistor.

A group of comparative NMOS transistors were manufactured through the conventional processes. The comparative transistors also had the channel length of about 20 nm and the line width of about 1400 nm.

In each of the comparative transistors, just the first spacer layer was provided with the gate structure without the second spacer. The first spacer of the comparative transistor was formed to a thickness of about 20 Å and included silicon nitride. The second spacer was not provided with the comparative transistor. Thus, an ion implantation process was performed on the substrate using the first spacer layer as the ion implantation mask, thereby forming the conventional source/drain extension region around the gate structure of the comparative transistor.

Figure 11:
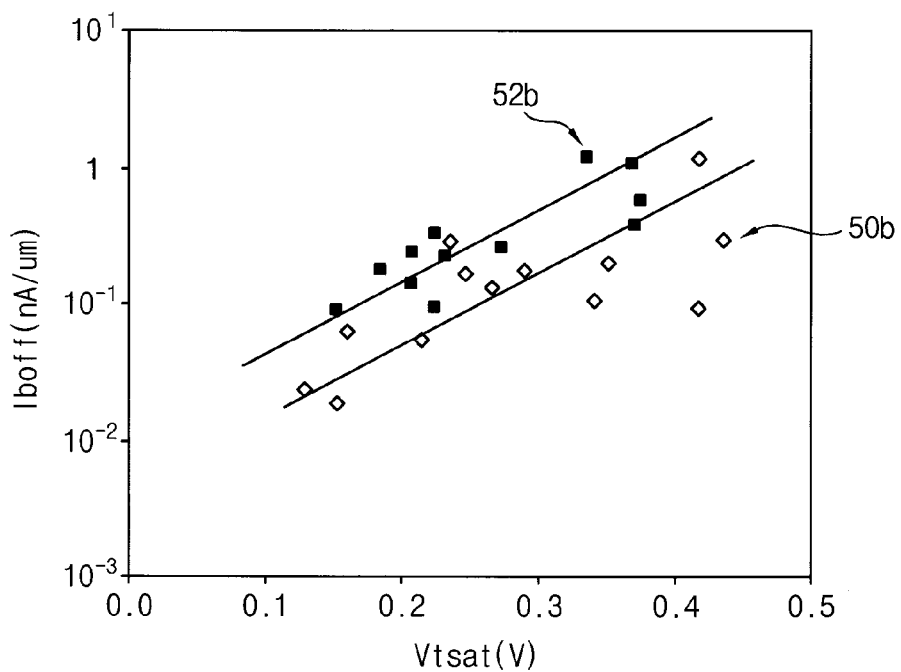
FIG. 11 is a graph showing a relation between a body-off current and a gate voltage of the sample transistors and the comparative transistors.

FIG. 11 is a graph showing a relation between a body-off current and a gate voltage of the sample transistors and the comparative transistors. In FIG. 11, the reference numeral 50b denotes a graph showing the relation between the body-off current and the gate voltage of the sample transistors and the reference numeral 52b denotes a graph showing the relation between the body-off current and the gate voltage of the comparative transistors. In FIG. 11, the body-off current was detected from a substrate body of each sample transistor under the conditions that about 0.9V was applied to the drain electrode of the sample transistor and a saturation threshold voltage was applied to the gate electrode of the sample transistor. In the same way, the body-off current was detected from a substrate body of each comparative transistor under the conditions that about 0.9V was applied to the drain electrode of the comparative transistor and a saturation threshold voltage was applied to the gate electrode of the comparative transistor.

Referring to FIG. 11, the body-off current detected from the sample transistors was much lower than the body-off current detected from the comparative transistors, and thus the GIDL was sufficiently reduced in the sample transistors.

Experiments on Overlap Capacitance

A group of sample NMOS transistors were manufactured through the same processes as described with reference to FIGS. 2A to 2G. The sample transistors had the channel length of about 20 nm and the line width of about 1000 nm. The sample transistor for the overlap capacitance experiment had the same structure as those for the above current leakage experiment except the line width of the gate structure.

A group of comparative NMOS transistors were manufactured through the conventional processes. The comparative transistors also had the channel length of about 20 nm and the line width of about 1000 nm. The comparative transistor for the overlap capacitance experiment also had the same structure as those for the above current leakage experiment except the line width of the gate structure.

Figure 12:
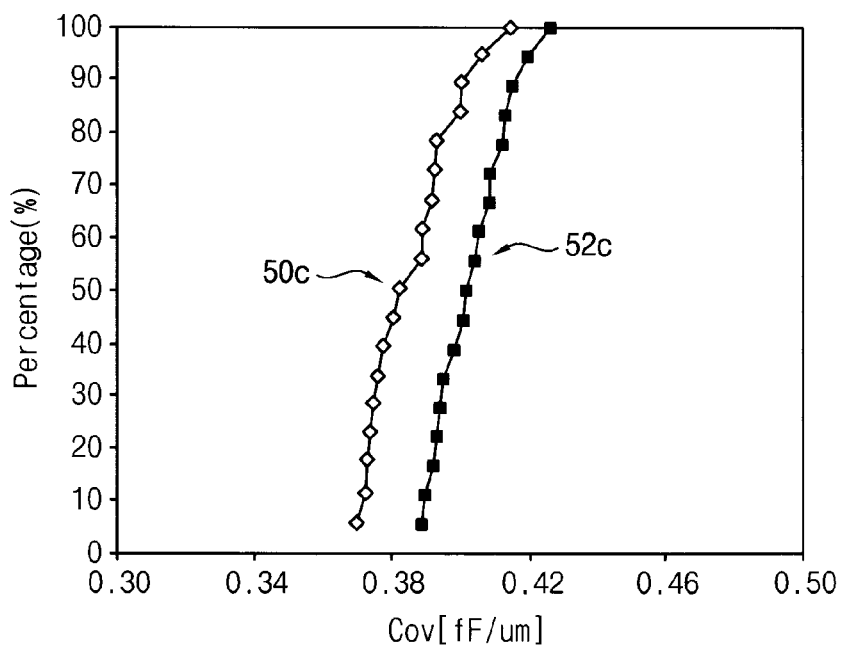
FIG. 12 is a graph showing an overlap capacitance of the sample transistor and the comparative transistor.

FIG. 12 is a graph showing an overlap capacitance of the sample transistor and the comparative transistor. In FIG. 12, the reference numeral 50c denotes a graph showing the overlap capacitances of the sample transistors and the reference numeral 52c denotes a graph showing the overlap capacitances of the comparative transistors.

Referring to FIG. 12, graph 50c is positioned to the left of graph 52c, which indicates that the overlap capacitance of the sample transistor was sufficiently lower than that of the comparative transistor.

Experiments on Electrical Characteristics of Transistors

A group of sample NMOS transistors were manufactured through the same processes as described with reference to FIGS. 2A to 2G. The sample transistors had the channel length of about 20 nm and the line width of about 1000 nm. The sample transistor for the experiment electrical characteristics had the same structure as those for the above overlap capacitance experiment.

A group of comparative NMOS transistors were manufactured through the conventional processes. The comparative transistors also had the channel length of about 20 nm and the line width of about 1000 nm. The comparative transistor for the experiment electrical characteristics also had the same structure as those for the above overlap capacitance experiment.

Figure 13:
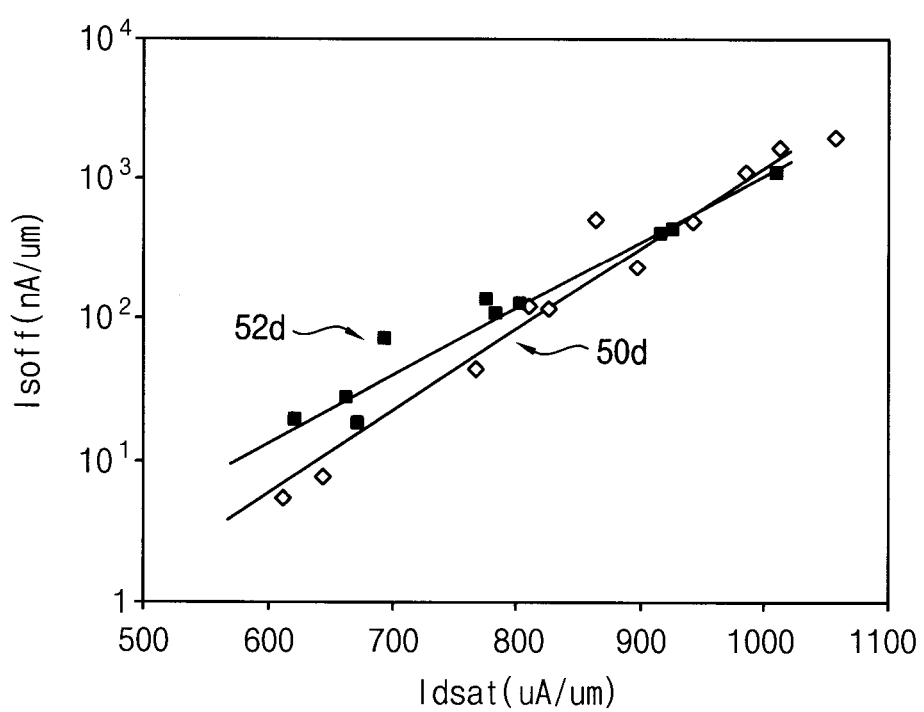
FIG. 13 is a graph showing a relation between off-currents and on-currents of the sample transistors and the comparative transistors.

FIG. 13 is a graph showing a relation between off-currents and on-currents of the sample transistors and the comparative transistors. In FIG. 13, the reference numeral 50d denotes a graph showing the relation between off-currents and on-currents of the sample transistors and the reference numeral 52d denotes the relation between off-currents and on-currents of the comparative transistors. A saturation drain current Idsat was detected as the on-current and an off-state source current Isoff was detected as the off-current under conditions that about 0.9V was applied to drain of the sample and comparative transistors in the experiments on electrical characteristics.

Referring to FIG. 13, graph 50d is positioned below graph 52d in an on-current range of about 600 μA/μm to about 1000 μA/μm. That is, the off-current of the sample transistor was lower than that of the comparative transistor at the same on-current, which indicates that the direct current (DC) characteristics of the sample transistors may be improved compared with the comparative transistors.

As confirmed by the above experiments, the MOS transistors of the example embodiment of the present inventive concepts has an improved short channel effect, current leakage characteristics and overlap capacitance characteristics compared with the conventional MOS transistor. Therefore, the MOS transistor of the present inventive concepts may have desirable device characteristics in spite of the high degree of integration.

According to the present example embodiments, the overlap size between the source/drain extension region and the gate electrode may be minimized or reduced in the MOS transistor with a sufficiently shallow junction at the surface portion of the substrate around the gate electrode. Therefore, the operation defects of the transistor such as the short channel effect, the leakage current and the punch-through may be prevented or inhibited in the MOS transistor. The MOS transistor may be adapted to high integrated semiconductor devices.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, the method comprising:
   forming a gate structure on a substrate, the gate structure including a gate insulation pattern and a gate electrode;
   forming a first spacer layer on a surface of the substrate conformal to the gate structure to a thickness of about 20 Å to about 50 Å;
   forming a second spacer layer on the first spacer layer;
   forming a second spacer on the first spacer layer corresponding to a sidewall of the gate structure by partially removing the second spacer layer from the first spacer layer;
   implanting first impurities in the substrate by an ion implantation process using the gate structure including the first spacer layer and the second spacer as an ion implantation mask to form source/drain extension regions at surface portions of the substrate around the gate structure;
   determining a distance of lateral diffusion of the first impurities in the substrate; and
   forming the first spacer layer plus the second spacer to have a thickness from the side all of the gate structure based on the determined distance.

2. The method of claim 1, wherein
   the forming a first spacer layer forms a layer made of a first insulation material, and
   the forming a second spacer layer forms a layer made of a second insulation material having an etching selectivity with respect to the first spacer layer.

3. The method of claim 1, wherein
   the forming a first spacer layer includes nitrogen, and
   the forming a second spacer layer includes oxygen.

4. Me method of claim 1, wherein the forming forms the second spacer layer to have a deposition thickness based on the determined distance.

5. The method of claim 1, wherein the forming a second spacer includes forming the second spacer to a thickness of about 20 Å to about 50 Å.

6. The method of claim 1, wherein the forming a gate structure includes forming the gate structure to have a line width of about 10 nm to about 30 nm.

7. The method of claim 1, wherein the forming a second spacer layer includes performing an anisotropic etching process until the second spacer layer is removed from the upper surface of the gate structure and from the surface of the substrate.

8. The method of claim 1, wherein the forming a second spacer layer includes performing an anisotropic etching process until the first spacer layer is exposed.

9. The method of claim 1, further comprising:
   removing the second spacer from the substrate after the implanting.

10. The method of claim 1, further comprising:
    forming a third spacer layer on the first spacer layer and the second spacer;
    partially removing the third spacer layer to form a third spacer on the second spacer; and
    implanting second impurities in the substrate by an ion implantation process using the gate structure including the first spacer layer, the second spacer and the third spacer as an ion implantation mask to form source/drain regions at surface portions of the substrate around the gate structure.

11. A method of manufacturing a semiconductor device, the method comprising:
   forming a gate structure on a substrate, the gate structure including a gate insulation pattern and a gate electrode;
   forming a preliminary spacer layer on a surface of the substrate conformal to the gate structure;
   forming a spacer layer conformal to the gate structure by partially removing the preliminary spacer layer from the substrate, the spacer layer having a first thickness as measured from the sidewall of the gate structure and a second thickness as measured from the surface of the substrate to the upper surface of the gate structure, the second thickness being smaller than the first thickness, the second thickness in a range of about 20 Å to about 50 Å;
   implanting impurities in the substrate by an ion implantation process using the gate structure including the spacer layer as an ion implantation mask to form source/drain extension regions at surface portions of the substrate around the gate structure;
   determining a distance of lateral diffusion of the impurities in the substrate; and
   forming the spacer layer to have the first thickness based on the determined distance.

12. The method of claim 11, wherein the forming a spacer layer forms the spacer layer to the first thickness in a range of about 40 Å to about 100 Å.

13. A method of manufacturing a semiconductor device, the method comprising:
   forming at least two spacer layers on a surface of a substrate conformal to a gate structure, the gate structure being formed on the substrate, the at least two spacer layers each having a thickness of about 20 Å to about 50 Å;
   implanting first impurities on the substrate by an ion implantation process using the gate structure including the at least two spacer layers as an ion implantation mask to form source/drain extension regions at surface portions of the substrate around the gate structure;
   determining a distance of lateral diffusion of the first impurities in the substrate; and
   forming the at least two spacer layers to have a thickness from the sidewall of the gate structure based on the determined distance.

14. The method of claim 13, wherein the forming at least two spacer layers comprises:
   forming a first spacer layer and a second spacer layer on the surface of the substrate conformal to the gate structure; and
   forming a second spacer on the first spacer layer corresponding to a sidewall of the gate structure by partially removing the second spacer layer from the first spacer layer.

15. The method of claim 14, further comprising:
   forming a third spacer layer on the first spacer layer and the second spacer;
   partially removing the third spacer layer to form a third spacer on the second spacer; and
   implanting second impurities in the substrate by an ion implantation process using the gate structure including the first spacer layer, the second spacer and the third spacer as an ion implantation mask to form source/drain regions at surface portions of the substrate around the gate structure.

16. The method of claim 13, wherein the forming forms the second spacer layer to have a deposition thickness based on the determined distance.

* * * * *